(12) United States Patent
Sharma et al.

(10) Patent No.: US 9,209,132 B2
(45) Date of Patent: *Dec. 8, 2015

(54) SEMICONDUCTOR COMPONENT AND METHOD OF MANUFACTURE

(71) Applicant: Semiconductor Components Industries, LLC, Phoenix, AZ (US)

(72) Inventors: Umesh Sharma, San Jose, CA (US); Rong Liu, San Jose, CA (US); Phillip Holland, Los Gatos, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/283,913

(22) Filed: May 21, 2014

(65) Prior Publication Data

US 2015/0028460 A1  Jan. 29, 2015

Related U.S. Application Data

(60) Provisional application No. 61/859,129, filed on Jul. 26, 2013.

(51) Int. Cl.
*H01L 27/02* (2006.01)
*H01L 23/522* (2006.01)
*H01L 23/528* (2006.01)
*H01L 23/532* (2006.01)

(52) U.S. Cl.
CPC ........ *H01L 23/5227* (2013.01); *H01L 23/5283* (2013.01); *H01L 27/0255* (2013.01); *H01L 27/0288* (2013.01); *H01L 23/5329* (2013.01); *H01L 23/53238* (2013.01); *H01L 2224/11* (2013.01); *H01L 2924/0002* (2013.01)

(58) Field of Classification Search
CPC .. H01L 23/5227; H01L 27/0248; H01L 21/02
See application file for complete search history.

(56) References Cited

U.S. PATENT DOCUMENTS

| | | |
|---|---|---|
| 4,953,002 A | 8/1990 | Nelson et al. |
| 5,051,667 A | 9/1991 | Dunham |
| 6,114,937 A | 9/2000 | Burghartz et al. |
| 6,396,032 B1 | 5/2002 | Denny et al. |
| 6,833,627 B2 | 12/2004 | Farnworth |
| 6,876,285 B2 | 4/2005 | Liang et al. |
| 6,906,369 B2 | 6/2005 | Ross et al. |
| 7,088,215 B1 | 8/2006 | Winter et al. |

(Continued)

FOREIGN PATENT DOCUMENTS

| | | |
|---|---|---|
| JP | 08203737 | 8/1996 |
| JP | 2002-101505 | 4/2002 |
| JP | 2006140229 | 6/2006 |

OTHER PUBLICATIONS

U.S. Appl. No. 14/444,143.*

(Continued)

*Primary Examiner* — John C Ingham
(74) *Attorney, Agent, or Firm* — Rennie William Dover

(57) ABSTRACT

A common mode filter monolithically integrated with a protection device. In accordance with an embodiment a semiconductor material having a resistivity of at least 5 Ohm-centimeters is provided. A protection device is formed from a portion of the semiconductor material and a dielectric material is formed over the semiconductor material. A coil is formed over the dielectric material.

17 Claims, 23 Drawing Sheets

(56) References Cited

U.S. PATENT DOCUMENTS

| | | |
|---|---|---|
| 7,396,701 B2 | 7/2008 | Shigemura et al. |
| 7,414,508 B2 | 8/2008 | Okuzawa et al. |
| 7,547,992 B2 | 6/2009 | Hiyama |
| 8,050,045 B2 | 11/2011 | Okuzawa et al. |
| 8,063,480 B2 | 11/2011 | Mukaibara |
| 8,514,596 B2 | 8/2013 | Koyama et al. |
| 2003/0086718 A1 | 5/2003 | Birumachi |
| 2003/0205778 A1 | 11/2003 | Yeo et al. |
| 2005/0258509 A1 | 11/2005 | Horikawa et al. |
| 2005/0285262 A1 | 12/2005 | Knapp et al. |
| 2006/0001520 A1 | 1/2006 | Kaji et al. |
| 2006/0068602 A1 | 3/2006 | Kamijima |
| 2007/0040163 A1 | 2/2007 | Okuzawa et al. |
| 2007/0075819 A1 | 4/2007 | Okuzawa |
| 2007/0200218 A1 | 8/2007 | Mukaibara |
| 2008/0297964 A1 | 12/2008 | Hiyama |
| 2010/0052838 A1 | 3/2010 | Matsuta et al. |
| 2012/0080803 A1* | 4/2012 | Holland et al. ................ 257/774 |
| 2013/0064326 A1* | 3/2013 | Chen et al. .................... 375/316 |

OTHER PUBLICATIONS

Sunderarajan S. Mohan, et al, Modeling and Characterization of On-Chip Transformers, IEEE, IEDM 98, Sep. 1998, 531-534.

ON Semiconductor, NUC2401MN Integrated Common Mode Choke with Integrated ESD Protection, Mar. 2009—Rev. 0. www.onsemi.com.

ON Semiconductor, NUC2401MN Integrated Common Mode Choke with Integrated ESD Protection, May 2009—Rev. 1. www.onsemi.com.

ON Semiconductor, ON Semiconductor Introduces Industry's First Common Mode Choke EMI Filter with Integrated ESD Protection for High-Speed Data Lines, Press Release Phoenix, Arizona, May 27, 2009, www.onsemi.com.

ON Semiconductor, ON Semiconductor Introduces Industry's First Common Mode Choke EMI Filter with Integrated ESD Protection for High-Speed Data Lines, Press Release May 27, 2009, www.businesswire.com.

ON Semiconductor, ON Semiconductor Introduces Industry's First Common Mode Choke EMI Filter with Integrated ESD Protection for High-Speed Data Lines, Press Release May 27, 2009, www.tradingmarkets.com.

ON Semiconductor, ON Semiconductor Introduces Industry's First Common Mode Choke EMI Filter with Integrated ESD Protection for High-Speed Data Lines, Press Release Jun. 1, 2009. http://www.ctimes.com.tw/DispProduct/en/EMI-filter/ON-Semiconductor/0906012227CS.shtml.

Common mode filter with ESD protection for USB 2.0 and MIPI D-PHY/MDDI interface, Doc ID 17815 Rev 2, Jun. 2011, pp. 1-15, www.st.com.

ON Semiconductor, Single Pair Common Mode Filter with ESD Protection, Publication Order No. EMI2121MT/D, Apr. 2013—Rev 2, pp. 1-9, www.onsemi.com.

* cited by examiner

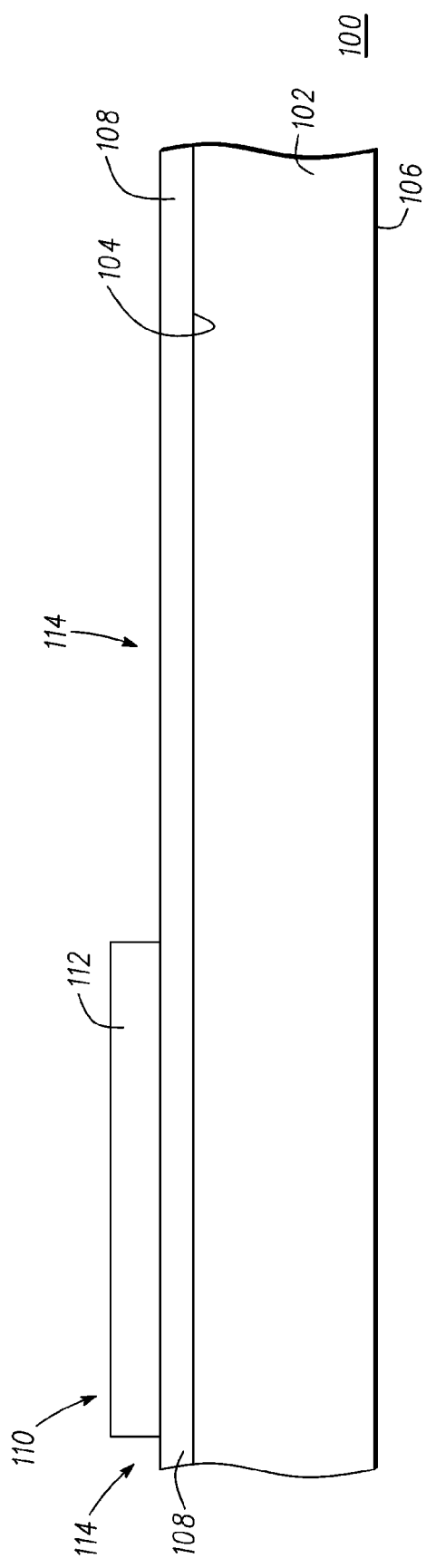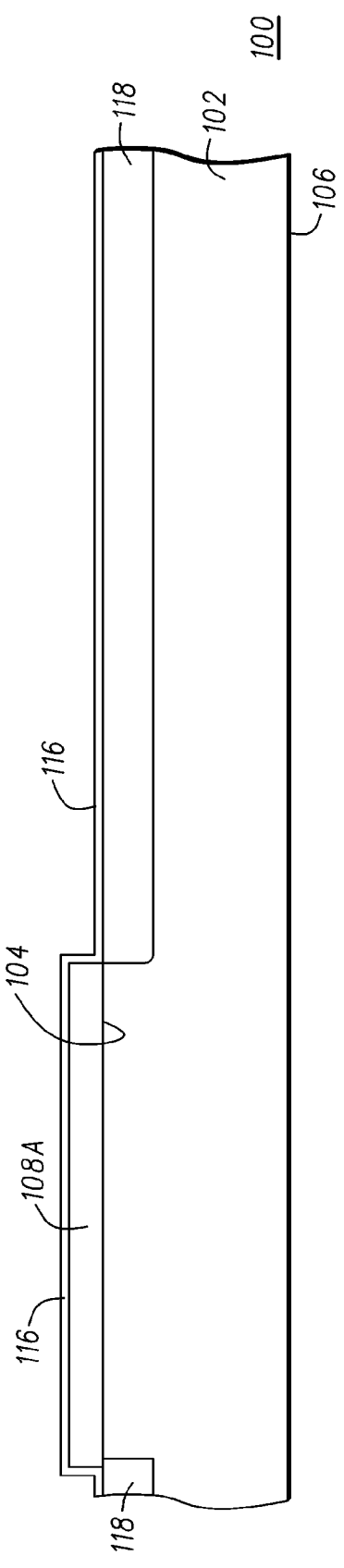

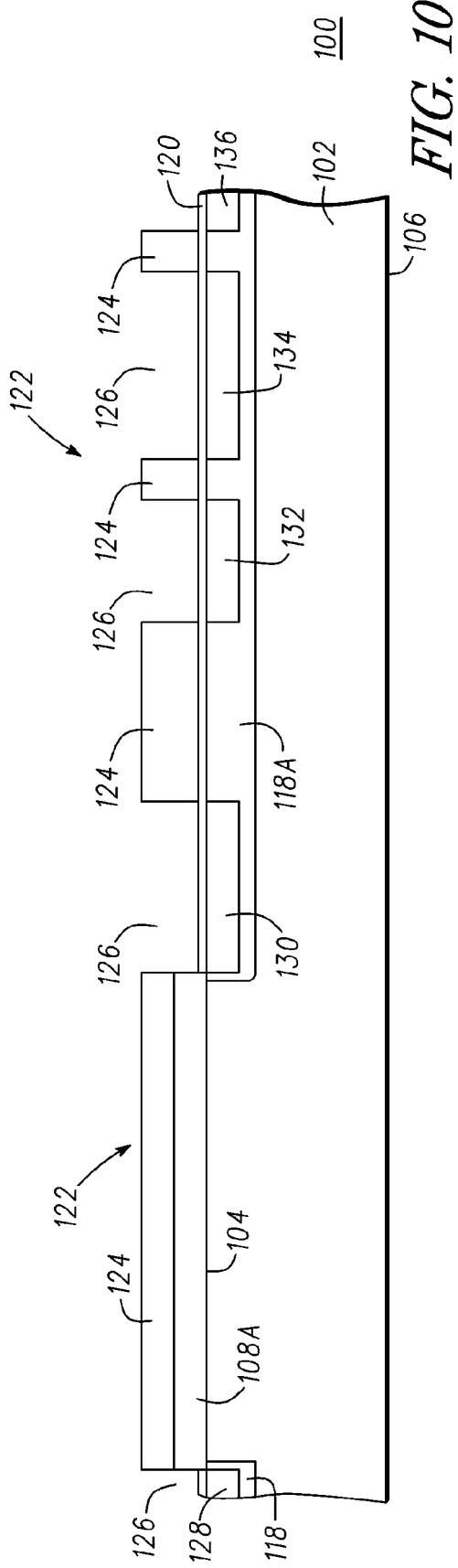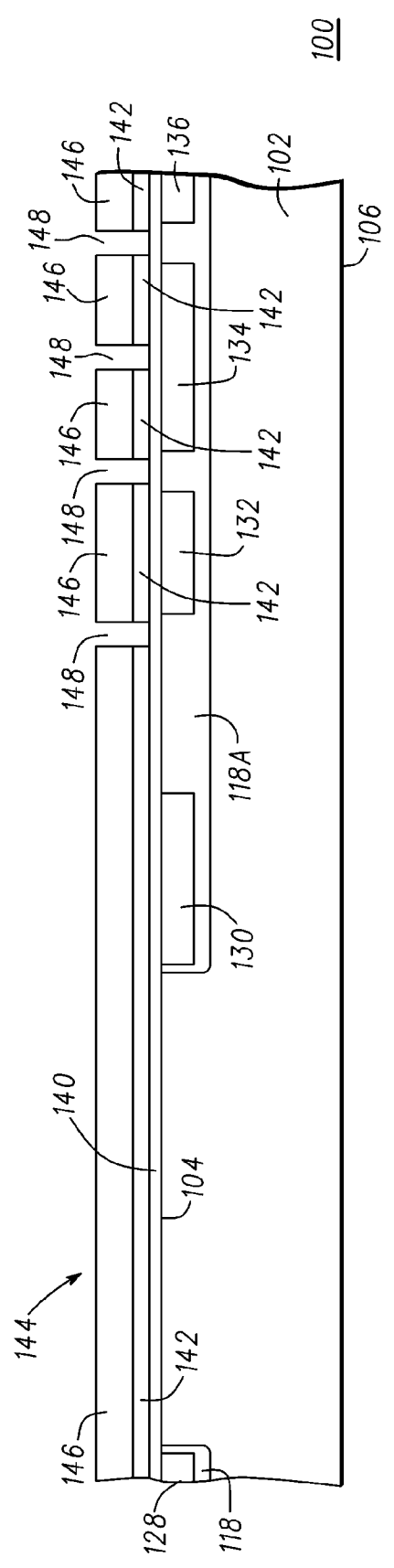

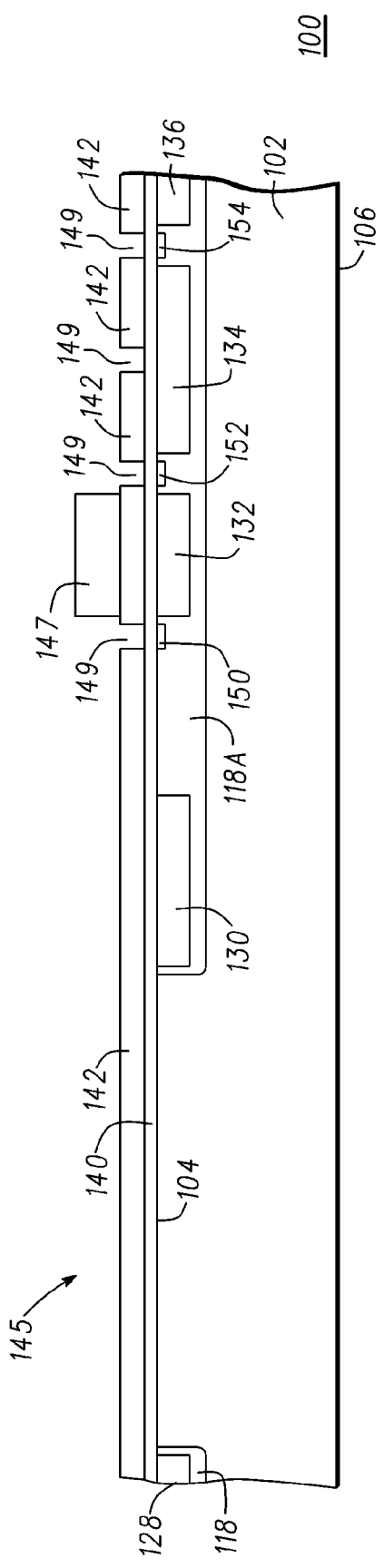
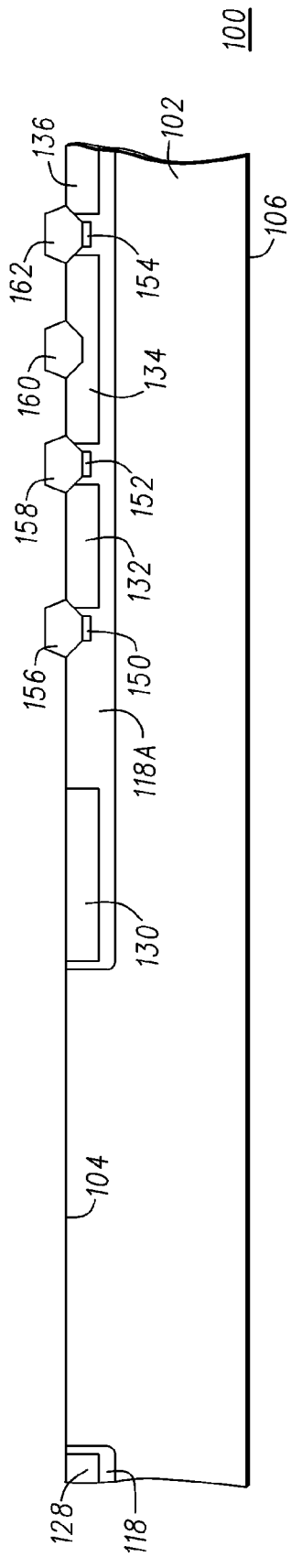

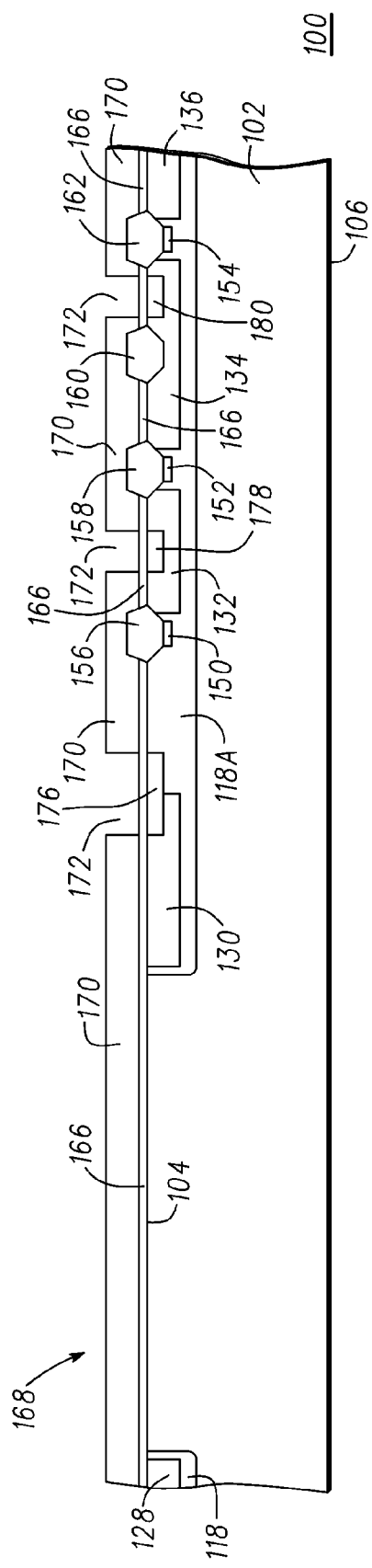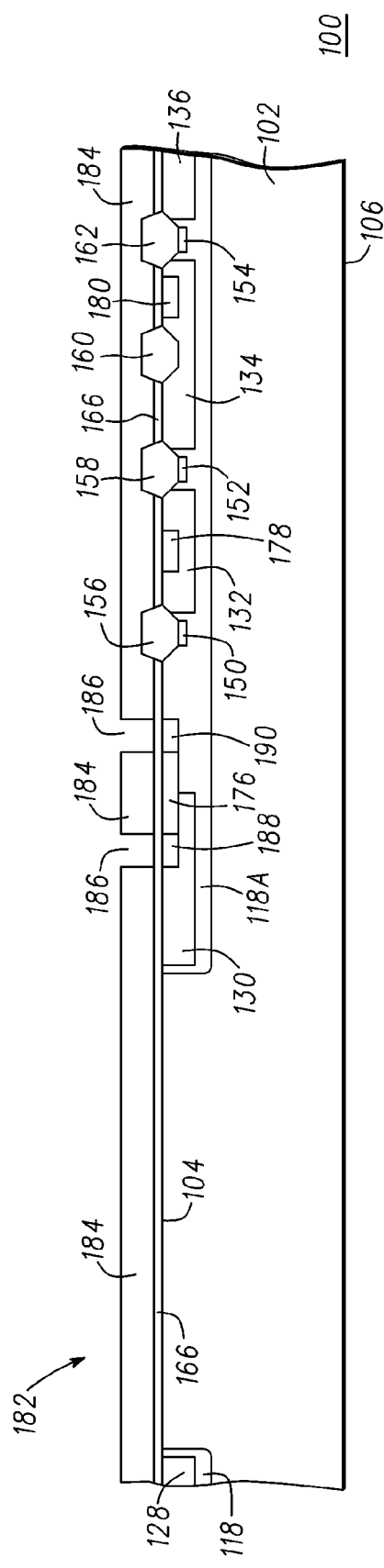

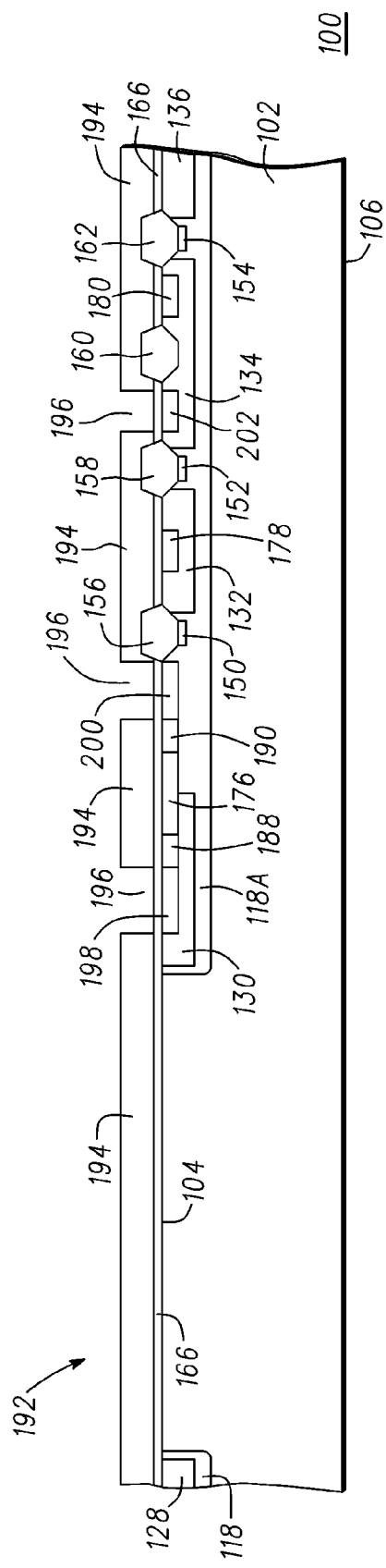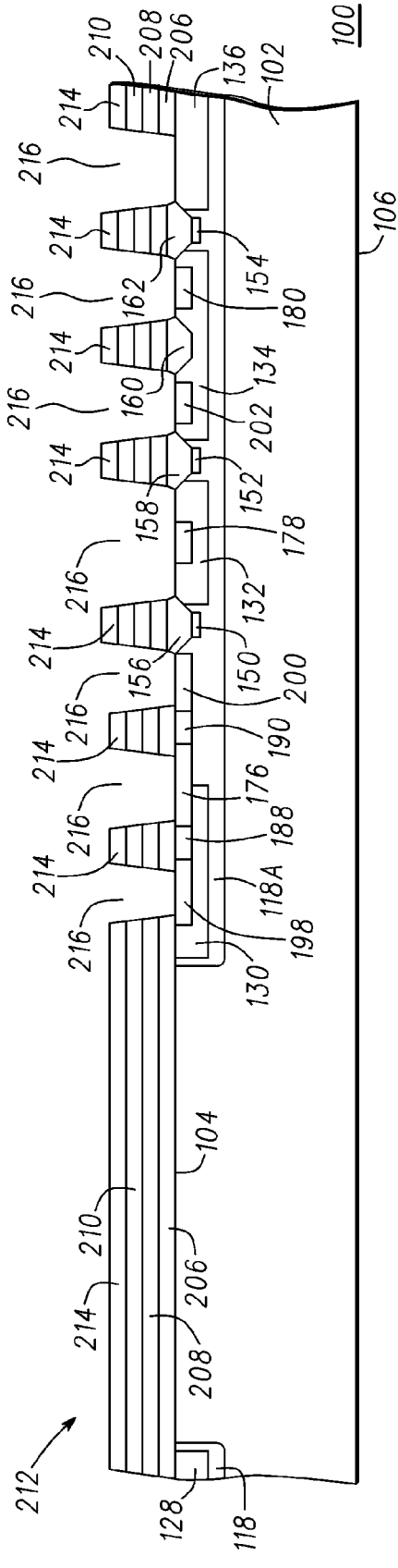

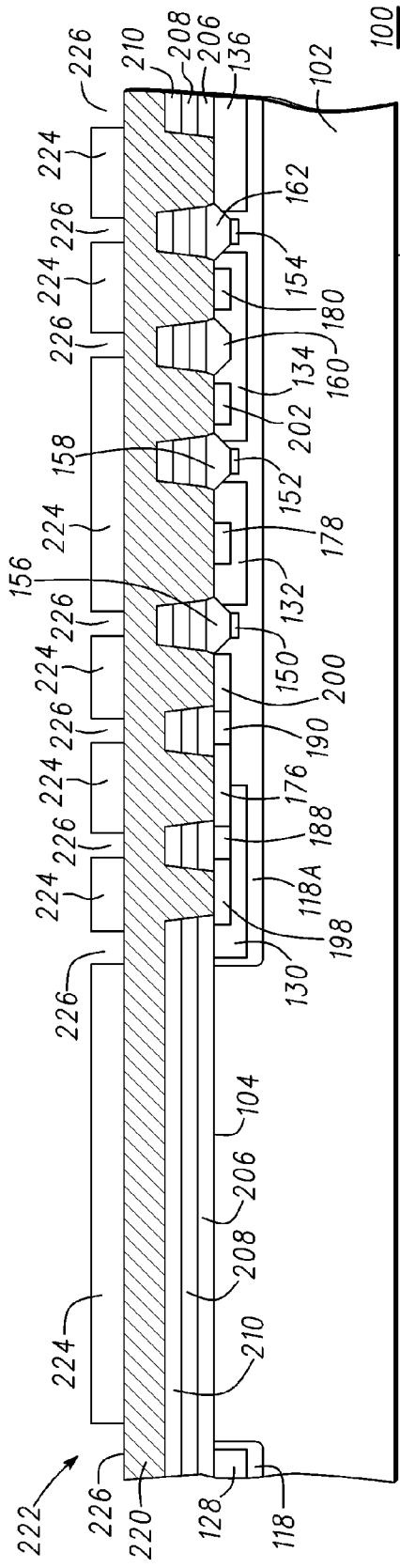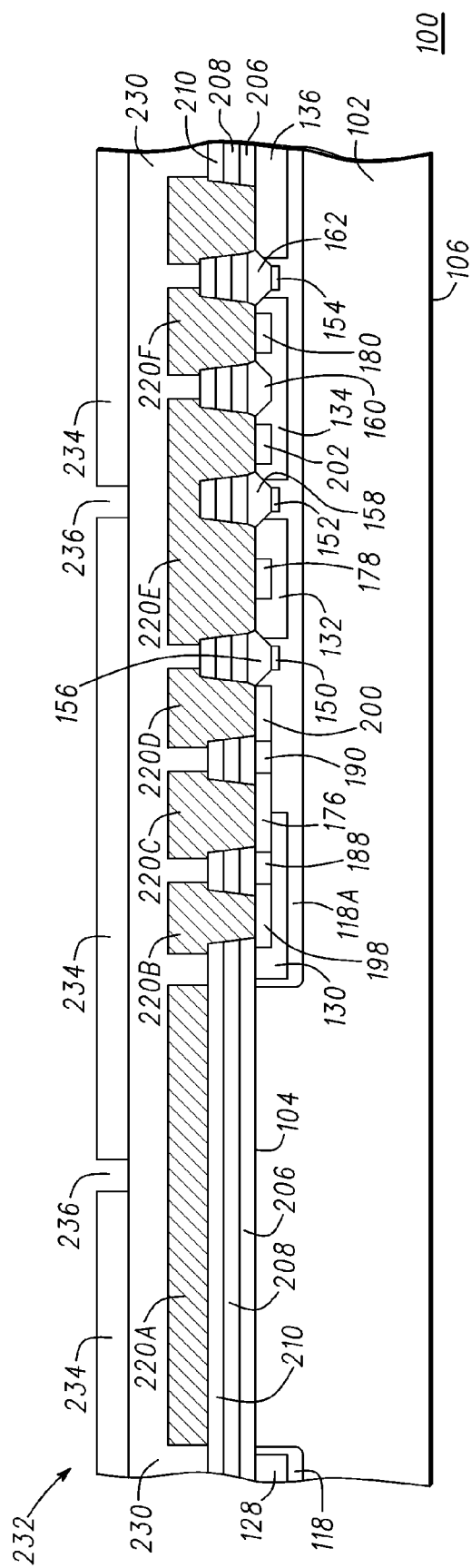

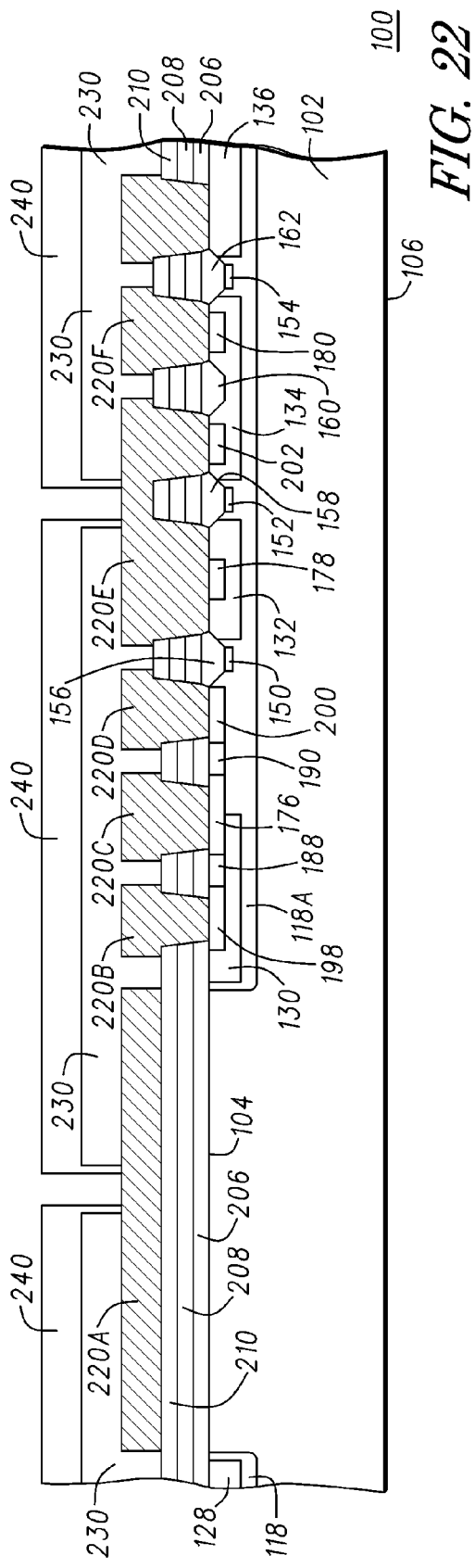
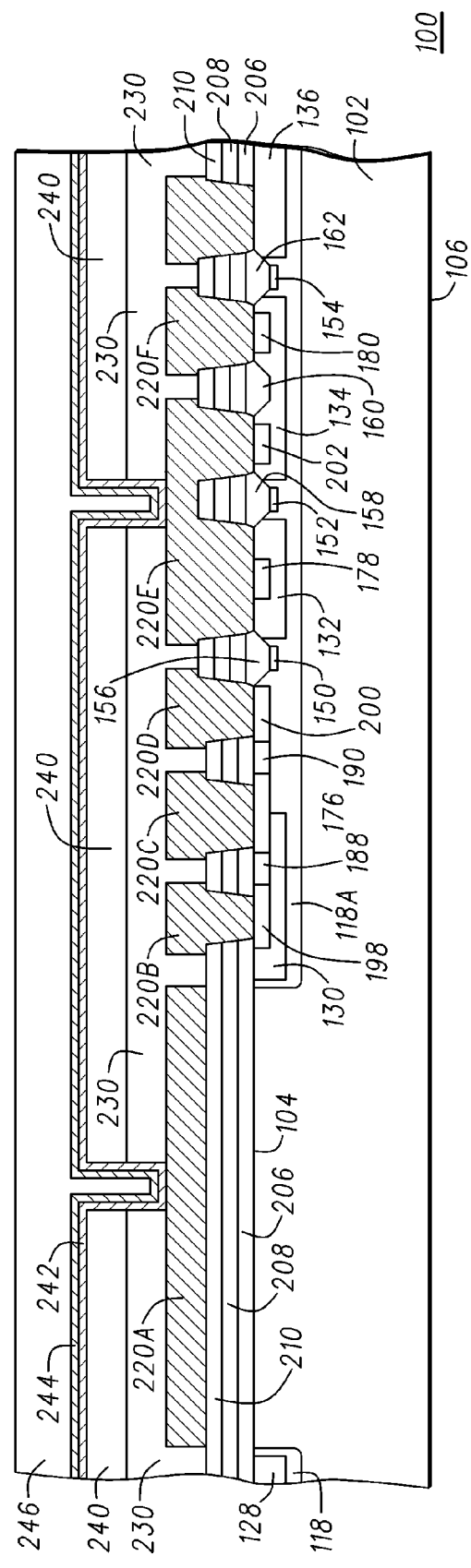

248

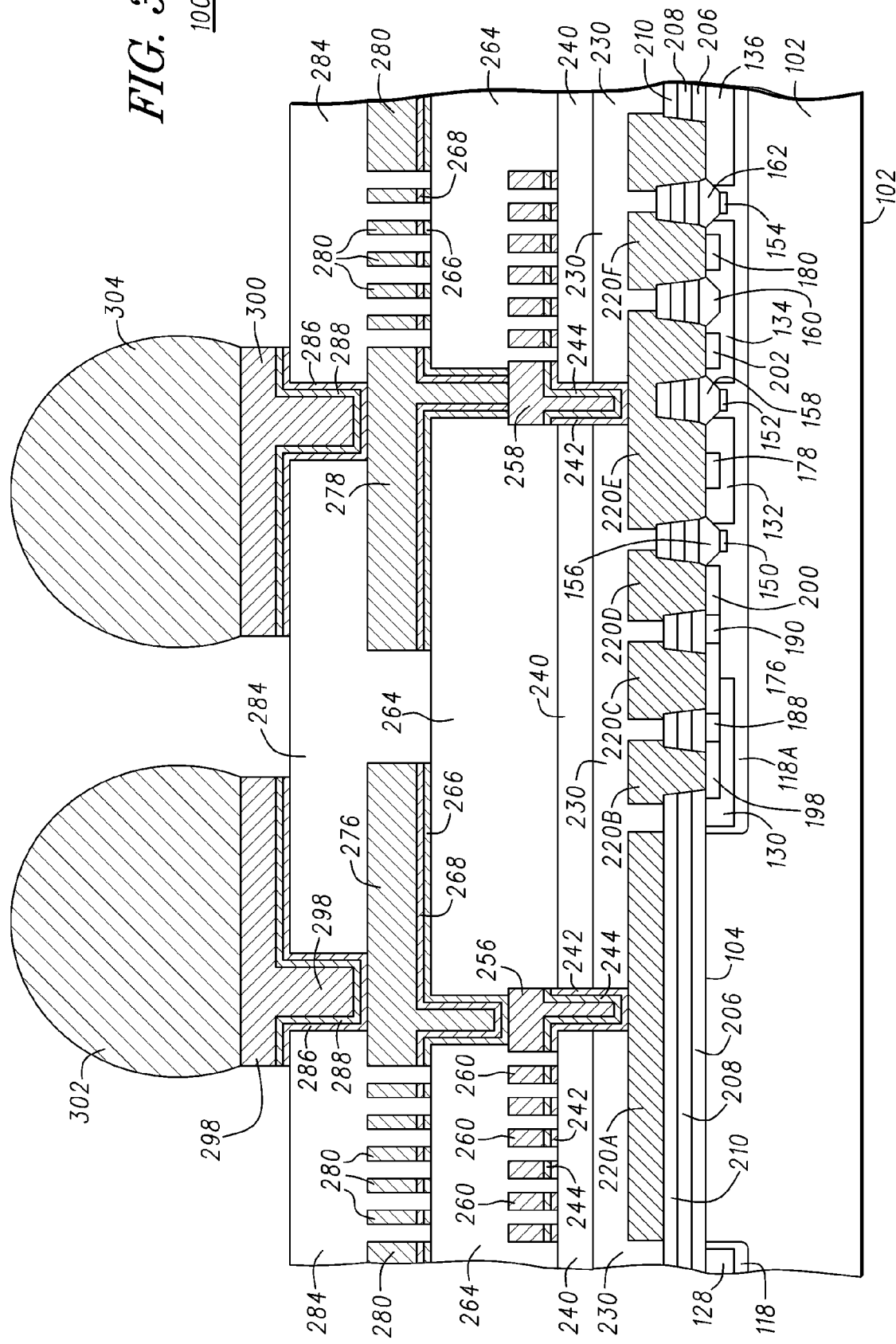

SEMICONDUCTOR COMPONENT AND METHOD OF MANUFACTURE

TECHNICAL FIELD

The present invention relates, in general, to semiconductor components and, more particularly, to signal transmission in semiconductor components.

BACKGROUND

Transmission protocols within communications systems may include the use of single-ended signals, differential signals, or combinations of single-ended and differential signals. For example, single-ended signals and differential signals are suitable for use in portable communications systems that employ low speed data transmission. However, in communications systems that employ high speed data transmission, it is desirable to use differential signals because of their noise immunity properties. These types of systems include mobile electronic devices such as, for example, smartphones, tablets, computers, and systems that include Universal Serial Bus (USB) applications. In addition to noise immunity, it is desirable to include protection from large transient voltage and current spikes, which can damage these systems. Typically, noise filters, also known as Common Mode Filters (CMF) and Electro-Static Discharge (ESD) protection circuits are mounted to a Printed Circuit Board (PCB) along with other circuitry of the communications system to reduce common mode noise on differential signal lines and to suppress large transient electrical spikes, respectively. This configuration of elements occupies a large area on a PCB, which is disadvantageous in mobile electronic devices. The ESD protection circuits are fabricated from low resistivity substrates to accommodate high currents encountered during ESD events. It is undesirable to manufacture filter elements such as inductor coils on a low resistivity substrate because of the presence of eddy currents which degrade filter performance.

Accordingly, it would be advantageous to have a structure and method for manufacturing a semiconductor component that provides protection from large electrical transients and provides noise filtering. It would be of further advantage for the structure and method to be cost efficient to implement.

BRIEF DESCRIPTION OF THE DRAWINGS

The present invention will be better understood from a reading of the following detailed description, taken in conjunction with the accompanying drawing figures, in which like reference characters designate like elements and in which:

FIG. 8 is a cross-sectional view of a semiconductor component at an early stage of manufacture in accordance with an embodiment of the present invention;

FIG. 9 is a cross-sectional view of the semiconductor component of FIG. 8 at a later stage of manufacture;

FIG. 10 is a cross-sectional view of the semiconductor component of FIG. 9 at a later stage of manufacture;

FIG. 11 is a cross-sectional view of the semiconductor component of FIG. 10 at a later stage of manufacture;

FIG. 12 is a cross-sectional view of the semiconductor component of FIG. 11 at a later stage of manufacture;

FIG. 13 is a is a cross-sectional view of the semiconductor component of FIG. 12 at a later stage of manufacture;

FIG. 14 is a cross-sectional view of the semiconductor component of FIG. 13 at a later stage of manufacture;

FIG. 15 is a cross-sectional view of the semiconductor component of FIG. 14 at a later stage of manufacture;

FIG. 16 is a cross-sectional view of the semiconductor component of FIG. 15 at a later stage of manufacture;

FIG. 17 is a cross-sectional view of the semiconductor component of FIG. 16 at a later stage of manufacture;

FIG. 18 is a cross-sectional view of the semiconductor structure of FIG. 17 at a later stage of manufacture;

FIG. 19 is a cross-sectional view of the semiconductor component of FIG. 18 at a later stage of manufacture;

FIG. 22 is a cross-sectional view of the semiconductor component of FIG. 21 at a later stage of manufacture;

FIG. 23 is a cross-sectional view of the semiconductor component of FIG. 22 at a later stage of manufacture;

FIG. 32 is a cross-sectional view of the semiconductor component of FIG. 31 at a later stage of manufacture.

Figure 1:
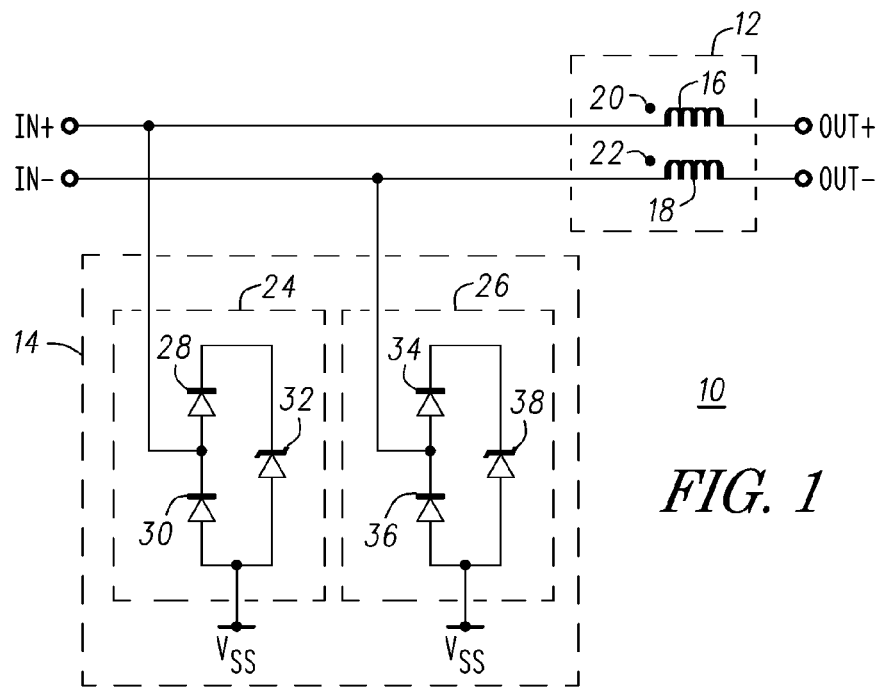
FIG. 1 is a circuit schematic of semiconductor component comprising a common mode filter monolithically integrated with a protection device in accordance with an embodiment of the present invention.

For simplicity and clarity of illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current flow through the device such as a gate of an MOS transistor or a base of a bipolar transistor. Although the devices are explained herein as certain n-channel or p-channel devices, or certain n-type or p-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of exactly as described.

DETAILED DESCRIPTION

Generally the present invention provides a semiconductor component that includes a common mode filter monolithically integrated with a protection device and a method for manufacturing the semiconductor component, wherein the semiconductor component is suitable for Chip Scale Packaging (CSP). The protection device may be referred to as a protection structure. In accordance with embodiments, methods are provided for monolithically integrating a common mode filter with a protection device. A semiconductor material having a resistivity of at least 5 Ohm-centimeters is provided, a protection device is formed from a portion of the semiconductor material and a common mode filter is monolithically integrated with the protection device. The high resistivity substrate reduces high frequency losses from the substrate and helps reduce eddy currents. The protection device may have a capacitance of less than about 5 picoFarads. A resistivity of a portion of the semiconductor substrate is decreased to be at least one order of magnitude less than that of the bulk of the substrate. Protection devices such as, for example, ElectroStatic Discharge (ESD) protection devices having a total capacitance of less than about 5 picoFarads can be manufactured in the portion of the substrate having the lower resistivity, i.e., the portion having a resistivity at least an order of magnitude less than the bulk of the substrate. In general, ESD protection devices provide inadequate protection when manufactured in semiconductor materials having a resistivity of greater than about 0.01 Ohm-centimeters because currents that flow in response to an ESD event flow through the substrate.

In accordance with embodiments of the present invention, coils of a common mode filter can be monolithically integrated at different vertical levels above the ESD devices, using one or more thick polyimide layers, e.g., polyimide layers having thicknesses greater than about 3 micrometers (μm). The thick polyimide layer(s) reduces capacitance and keeps coils from different conductive layers from shorting together. The thick polyimide also lowers eddy currents.

In accordance with another embodiment, a method for monolithically integrating an ESD protection device with a common mode filter includes lowering the resistivity of a portion of a high resistivity substrate and manufacturing the ESD protection device in the portion of the substrate having the lower resistivity. A common mode filter may be manufactured above the ESD protection device.

In accordance with another embodiment, the resistivity of a portion of a semiconductor substrate is decreased by at least an order of magnitude and a protection device is manufactured in the portion of the semiconductor substrate having the lowered resistivity. A material is formed over the semiconductor substrate and a coil of a common mode filter is manufactured above the material.

FIG. 1 is a circuit schematic of semiconductor component 10 comprising a common mode filter (CMF) 12 monolithically integrated with a protection device 14 over a semiconductor material in accordance with an embodiment of the present invention. What is shown in FIG. 1 is common mode filter 12 comprising coils 16 and 18 in a differential configuration. Coil 16 has an input IN+ and output OUT+ that form portions of a differential input and a differential output, respectively. Coil 18 has an input IN− and output OUT− that form portions of the differential input and a differential output, respectively. Inputs IN+ and IN− form a differential input and outputs OUT+ and OUT− form a differential output. Dots 20 and 22 indicate the magnetic coupling of coils 16 and 18. By way of example, protection device 14 includes a protection module 24 connected to input terminal IN+ of coil 16 and a protection module 26 connected to input terminal IN− of coil 18. Protection module 24 is comprised of a pair of diodes 28 and 30 and a Zener diode 32. The cathode of diode 28 is connected to the cathode of Zener diode 32 and the anode of diode 30 is connected to the anode of Zener diode 32. The anodes of diodes 30 and 32 are coupled for receiving a source of operating potential such as, for example, an operating potential $V_{SS}$. By way of example, operating potential $V_{SS}$ is a ground potential. The anode and cathode of diodes 28 and 30, respectively, are commonly connected together and to input terminal IN+ of coil 16. Diodes 28 and 30 may be referred to as steering diodes, where diode 28 may also be referred to as a top or up diode and diode 30 may also be referred to as a down or bottom diode.

Protection module 26 is comprised of a pair of diodes 34 and 36 and a Zener diode 38. The cathode of diode 34 is connected to the cathode of Zener diode 38 and the anode of diode 36 is connected to the anode of Zener diode 38. The anodes of diodes 36 and 38 are coupled for receiving a source of operating potential such as, for example, an operating potential $V_{SS}$. The anode and cathode of diodes 34 and 36, respectively, are commonly connected together and to input terminal IN− of coil 18. Diodes 34 and 36 may be referred to as steering diodes, where diode 34 may be referred to as an up or top diode and diode 36 may be referred to as a down or bottom diode. It should be noted that Zener diodes 32 and 38 may be realized from doped regions 176, 188, and 190 described with reference to FIG. 15, up diodes 28 and 34 may be realized from doped regions 134, 180, and 202 and a portion of p-well 118A described with reference to FIG. 19, and down diodes 30 and 36 may be realized from doped regions 132, 178, and 200 and a portion of p-well 128 described with reference to FIG. 19.

Figure 2:
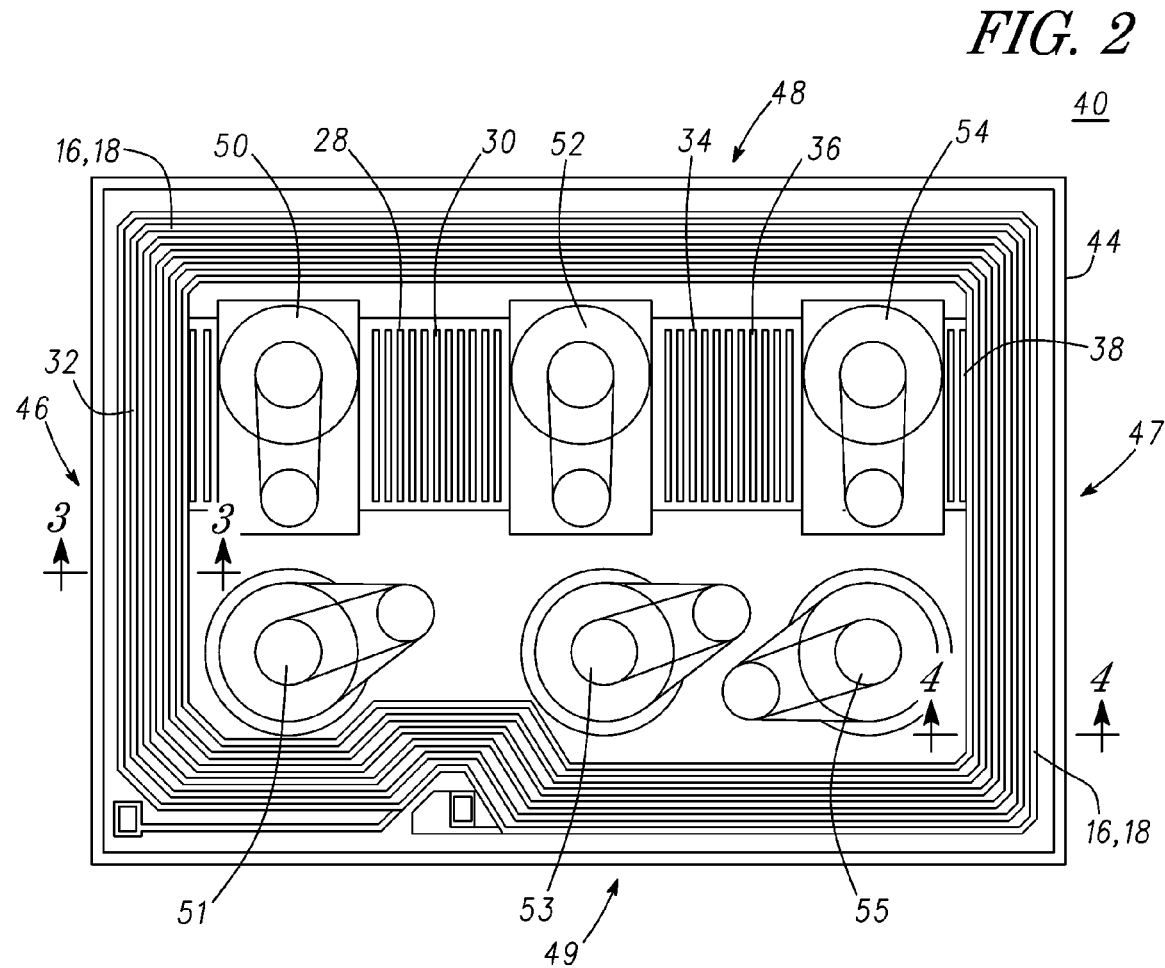
FIG. 2 is a layout of a Chip Scale Package (CSP) in accordance with an embodiment of the present invention which may include semiconductor component 10 of FIG. 1.

FIG. 2 is a layout of a Chip Scale Package (CSP) 40 which may include semiconductor component 10 formed from a semiconductor chip 44 having opposing sides 46 and 47 and opposing sides 48 and 49. It should be noted that in accordance with embodiments a chip scale package includes a semiconductor chip having underbump metal (UBM) pads and a separate solder ball mounted to each UBM pad. Chip scale package 40 includes coils 16 and 18 of CMF 12 around a peripheral portion of a semiconductor chip 44, steering diodes 28 and 30 and steering diodes 34 and 36 in central portions of semiconductor chip 44, Zener diode 32 below a portion of coils 16 and 18 near side 46 of semiconductor chip 44, and Zener diode 38 below a portion of coils 16 and 18 near side 47 of semiconductor chip 44. It should be noted that coils 16 and 18 are positioned at two different vertical levels relative to each other and that coil 18 may be over coil 16 as illustrated in FIGS. 3 and 4.

Figure 3:
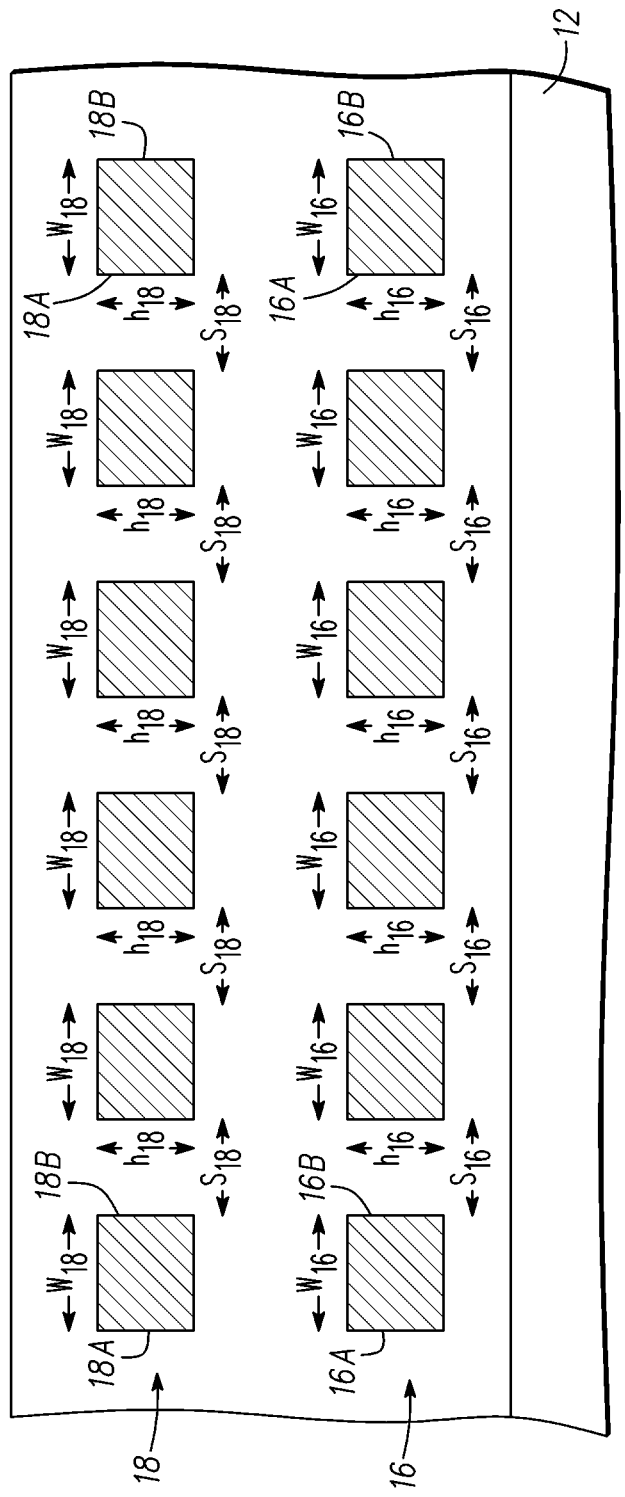
FIG. 3 is a cross-sectional view of a portion of the CSP of FIG. 2 taken along section line 3-3 of FIG. 2.

Briefly referring to FIG. 3 a cross-sectional view of coils 16 and 18 taken along section line 3-3 of FIG. 2 is shown. Coil 18 overlies coil 16. Coil 16 has a height $h_{16}$, a width $w_{16}$, and a spacing $s_{16}$ and coil 18 has a height $h_{18}$, a width $w_{18}$ and a spacing $s_{18}$. The dimensions $h_{16}$, $w_{16}$, $s_{16}$, $h_{18}$, $w_{18}$, and $s_{18}$ are selected to maximize the magnetic coupling between coil elements, reduce the Direct Current (DC) resistance of the coils 16 and 18, and reduce the capacitance to semiconductor material 12 and to aluminum conductive layers. More particularly, the spacing dimensions $s_{16}$ and $s_{18}$ are selected to lower, and preferably minimize, the area occupied by coils 16 and 18 and the height and width dimensions $h_{16}$, $h_{18}$, $w_{16}$, and $w_{18}$, are selected to reduce the DC resistance. In addition, the width dimensions $w_{16}$, and $w_{18}$ are made small to decrease, and preferably minimize, the capacitance. To increase, and preferably, maximize the magnetic coupling, the edges or sidewalls of a coil 16 are vertically aligned with the edges or sidewalls of a corresponding coil 18. For example, edges 16A are aligned to corresponding edges 18A and edges 16B are aligned to corresponding edges 18B. Although, coil 18 is shown as perfectly overlying coil 16, i.e., the edges of coil 18 align with the corresponding edges of coil 18, this is not a limitation. For example, the edges of coil 18 may be over a portion of coil 16 that is between adjacent edges of coil 16.

Figure 4:
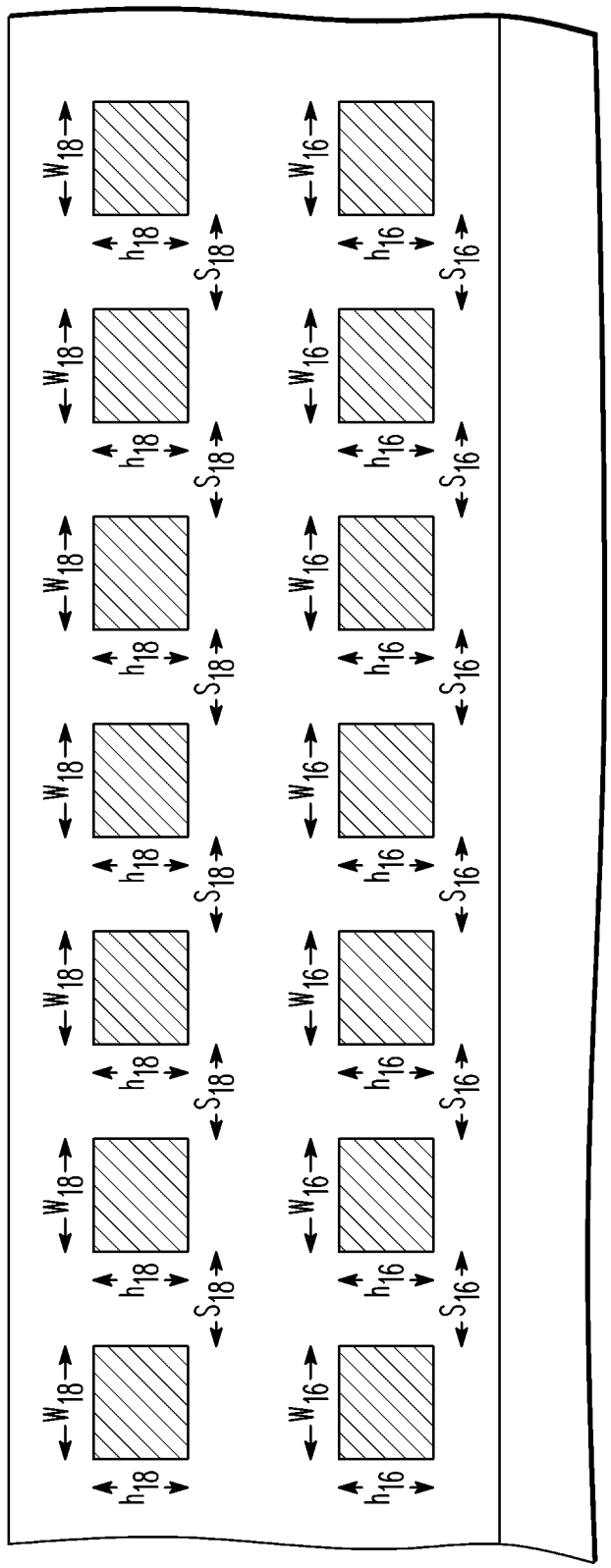
FIG. 4 is a cross-sectional view of a portion of the CSP of FIG. 2 taken along section line 4-4 of FIG. 2.

Briefly referring to FIG. 4 a cross-sectional view of coils 16 and 18 taken along section line 4-4 of FIG. 2 is shown. As described above, coil 16 has a height $h_{16}$, a width $w_{16}$, and a spacing $s_{16}$ and coil 18 has a height $h_{18}$, a width $w_{18}$ and a spacing $s_{18}$. Although, coil 18 is shown as perfectly overlying coil 16, i.e., the edges of coil 16 align with the corresponding edges of coil 18, this is not a limitation. For example, the edges of coils 18 may be over a portion of coil 16 that is between adjacent edges of coil 16.

Referring again to FIG. 2, semiconductor component 10 further includes UBM pads 50, 51, 52, 53, 54, and 55 to which solder balls may be coupled. By way of example, UBM pad 50 serves as a UBM layer for input IN+, UBM pad 51 serves as a UBM layer for output OUT+, UBM pad 52 serves as a UBM layer for input IN−, UBM pad 53 serves as a UBM layer for output OUT−; UBM pad 54 serves as a UBM layer for an input terminal connected to an ESD protection device that can be used to provide ESD protection to circuits electrically connected to this terminal, and UBM pad 55 serves as a UBM layer configured to be coupled to a potential $V_{SS}$, which may be, for example, ground. It should be noted steering diodes such as, for example, steering diodes 28, 30, 34, and 36 may be positioned under corresponding UBM pads.

Figure 5:
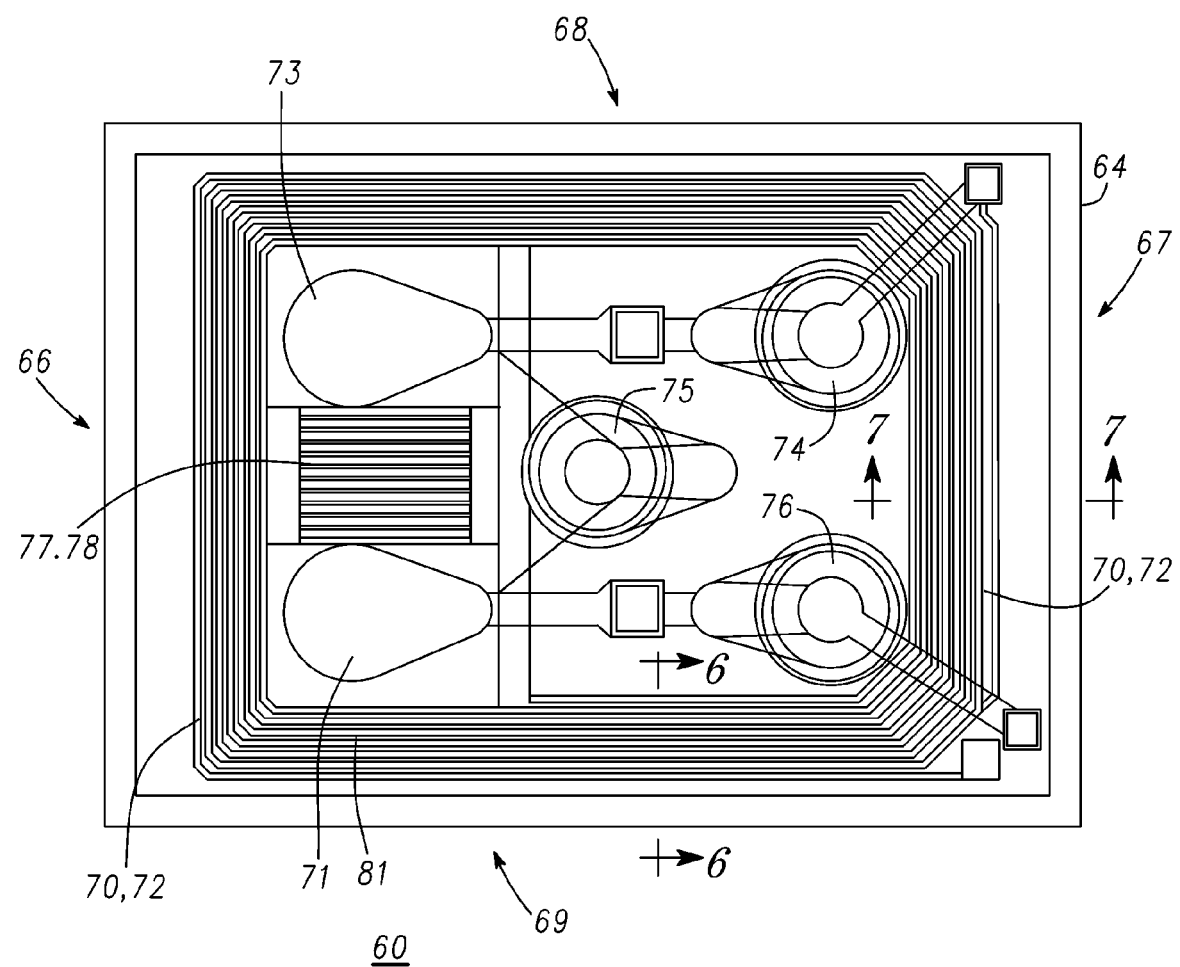
FIG. 5 is a layout of a CSP in accordance with another embodiment of the present invention which may include semiconductor component 10 of FIG. 1.

Referring now to FIG. 5, a layout of a CSP 60 which may include semiconductor component 10 formed from a semiconductor chip 64 having opposing sides 66 and 67 and opposing sides 68 and 69. CSP 60 includes coils 70 and 72 of CMF 12 around a peripheral portion of a semiconductor chip 64, UBM pads 71, 73, 74, 75, and 76 surrounded by coils 70 and 72, and Zener diodes 77 and 78 laterally adjacent to and laterally between UBM pads 71 and 73. Diodes such as, for example, steering diodes 28, 30, 34, and 36 may be positioned under corresponding UBM pads 74 and 76. It should be noted that coils 70 and 72 are positioned at two different vertical levels relative to each other and that coil 72 may be over coil 70 as illustrated in FIGS. 6 and 7.

Figure 6:
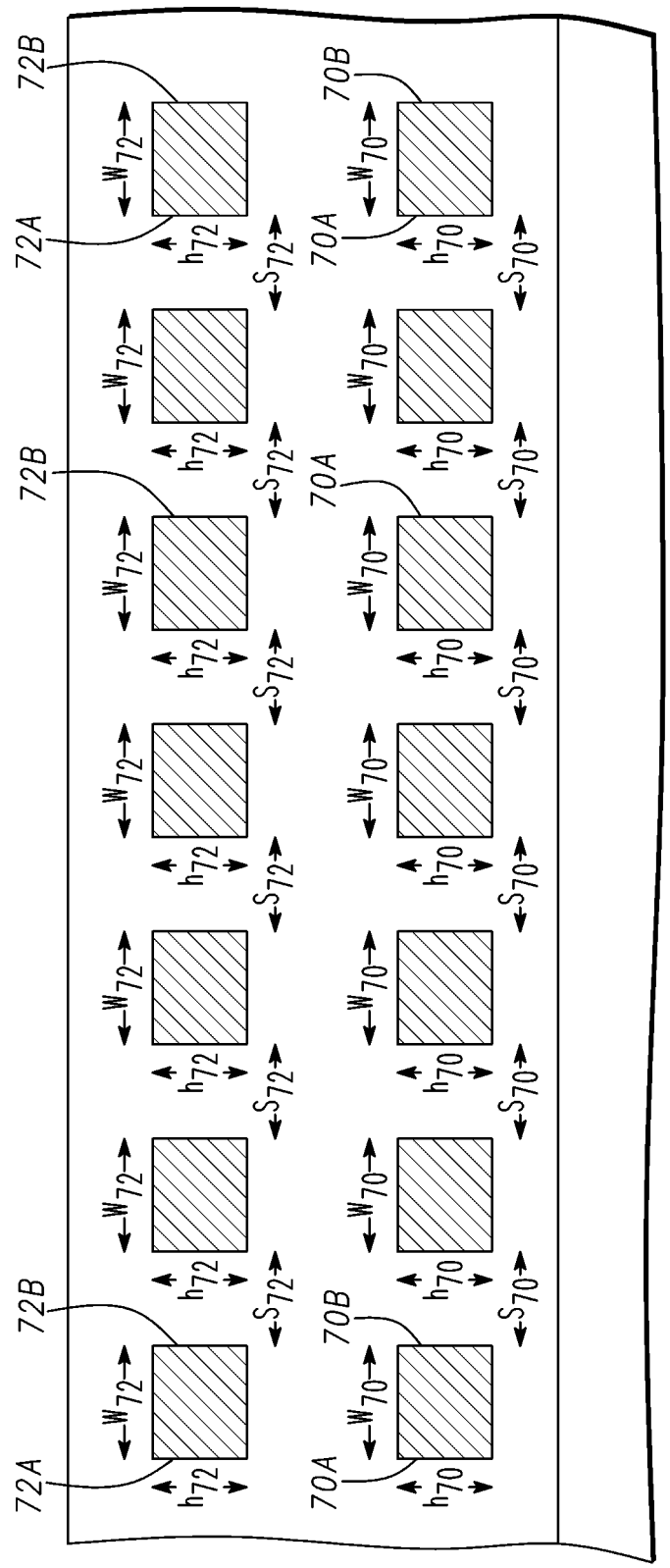
FIG. 6 is a cross-sectional view of a portion of the CSP taken along section line 6-6 of FIG. 5.

Briefly referring to FIG. 6 a cross-sectional view of coils 70 and 72 taken along section line 6-6 of FIG. 5 is shown. Coil 72 overlies coil 70. Coil 70 has a height $h_{70}$, a width $w_{70}$, and a spacing $s_{70}$ and coil 72 has a height $h_{72}$, a width $w_{72}$ and a spacing $s_{72}$. The dimensions $h_{70}$, $w_{70}$, $s_{70}$, $h_{72}$, $w_{72}$, and $s_{72}$ are selected to maximize the magnetic coupling between coil elements, reduce the DC resistance of the coils 70 and 72, and reduce the capacitance to semiconductor material 12 and to aluminum conductive layers. More particularly, the spacing dimensions $s_{70}$ and $s_{72}$ are selected to lower, and preferably minimize, the area occupied by coils 70 and 72 and the height and width dimensions $h_{70}$, $h_{72}$, $w_{70}$, and $w_{72}$, are selected to reduce the DC resistance. In addition, the width dimensions $w_{70}$, and $w_{72}$ are made small to decrease, and preferably minimize, the capacitance. To increase, and preferably, maximize the magnetic coupling, the edges or sidewalls of a coil 70 are vertically aligned with the edges or sidewalls of a corresponding coil 72. For example, edges 70A are aligned to corresponding edges 72A and edges 70B are aligned to corresponding edges 72B. Although, coil 72 is shown as perfectly overlying coil 70, i.e., the edges of coil 70 align with the corresponding edges of coil 72, this is not a limitation. For example, the edges of coil 72 may be over a portion of coil 70 that is between adjacent edges of coil 70.

Figure 7:
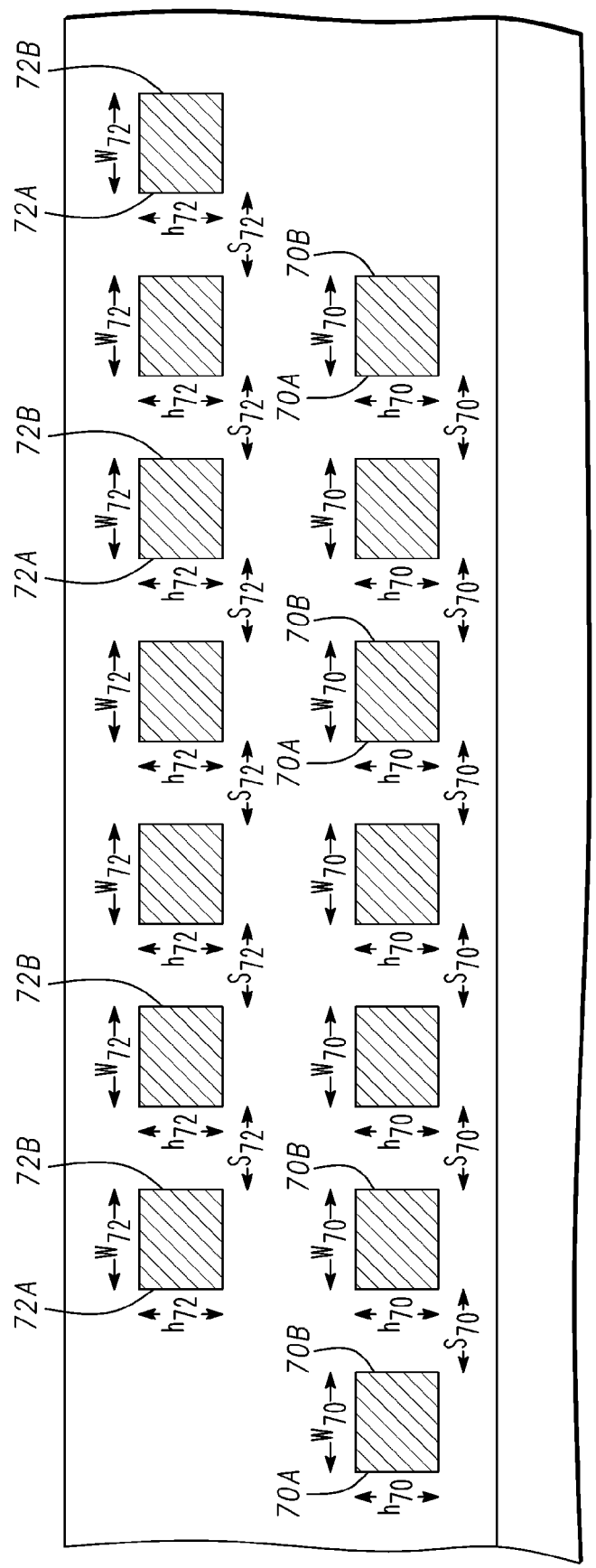
FIG. 7 is a cross-sectional view of a portion of the CSP taken along section line 7-7 of FIG. 5.

Briefly referring to FIG. 7, a cross-sectional view of coils 70 and 72 taken along section line 7-7 of FIG. 5 is shown. As described above, coil 70 has a height $h_{70}$, a width $w_{70}$, and a spacing $s_{70}$ and coil 72 has a height $h_{72}$, a width $w_{72}$ and a spacing $s_{72}$. Although, coil 72 is shown as perfectly overlying coil 70, i.e., the edges of coil 72 align with the corresponding edges of coil 70, this is not a limitation. For example, the edges of coil 72 may be over a portion of coil 70 that is between adjacent edges of coil 70.

FIG. 8 is a cross-sectional view of a portion of a semiconductor component 100 such as for example, a common mode filter monolithically integrated with a protection device over a semiconductor material during manufacture in accordance with an embodiment of the present invention. What is shown in FIG. 8 is a semiconductor material 102 having opposing surfaces 104 and 106. Surface 104 is also referred to as a front or top surface and surface 106 is also referred to as a bottom or back surface. In accordance with this embodiment, semiconductor material 102 comprises a semiconductor substrate doped with an impurity material of p-type conductivity and has a resistivity of at least about 5 Ohm-centimeters (Ω-cm). Preferably, the resistivity of substrate 102 is 100 Ω-cm. More preferably, the resistivity of substrate 102 is 500 Ω-cm or more, i.e., at least 500 Ω-cm, and even more preferably the resistivity of substrate 102 is 1,000 Ω-cm or more, i.e., at least 1,000 Ω-cm. Suitable materials for substrate 102 include silicon, compound semiconductor materials such as, for example, gallium nitride, gallium arsenide, indium phosphide, Group III-V semiconductor materials, Group II-VI semiconductor materials, or the like. In accordance with other embodiments, semiconductor material 102 is comprised of an epitaxial layer formed on a semiconductor substrate, where the semiconductor substrate is silicon doped with a p-type impurity material and has a resistivity of at least 100 Ω-cm and the epitaxial layer is doped with an impurity material of p-type conductivity and has a resistivity of at least 100 Ω-cm. It should be noted that a region or layer doped with an n-type dopant or impurity material is said to be of an n-type conductivity or an n conductivity type and a region or layer doped with a p-type dopant or impurity material is said to be of a p-type conductivity or a p conductivity type.

A layer of dielectric material 108 is formed on or from semiconductor substrate 102. In accordance with an embodiment of the present invention, the material of dielectric layer 108 is silicon dioxide having a thickness ranging from about 1,000 Angstroms (Å) to about 10,000 Å. Techniques for forming silicon dioxide layer 108 are known to those skilled in the art. For example, silicon dioxide layer 108 may be formed by oxidizing semiconductor substrate 102 or it may be a TEOS layer formed using plasma enhanced chemical vapor deposition. Still referring to FIG. 8, a layer of photoresist is patterned over dielectric layer 108 to form a masking structure 110 having a masking element 112 and openings 114 that expose portions of dielectric layer 108.

Referring now to FIG. 9, the portions of dielectric layer 108 unprotected by masking element 112 are removed using a wet etchant that selectively etches the material of dielectric layer 108. By way of example, the wet etchant is a buffered oxide etchant. The etch leaves portion 108A of dielectric layer 108 and exposes portions of surface 104. Portion 108A may be referred to as an implant mask and has sidewalls and a surface. Masking element 112 is removed and substrate 102 is treated to an HF dip to remove oxide that may have formed on the exposed portions of surface 104. A pad oxide layer 116 having a thickness ranging from about 150 Å to about 400 Å is formed on the exposed portions of surface 104 by placing semiconductor substrate 102 into a furnace that provides an ambient temperature of about 900 degrees Celsius (° C.). Although pad oxide layer 116 is shown as being formed on the sidewalls and surface of implant mask 108A, this is not a limitation of the present invention. The process for forming pad oxide layer 116 may be such that pad oxide layer 116 is not formed on implant mask 108A or the thickness formed on implant mask 108A is very small. It should be noted that a pad oxide may be referred to as a screen oxide.

One or more p-wells 118 is formed in semiconductor substrate 102 by implanting an impurity material of p-type conductivity into substrate 102 and driving the impurity material into semiconductor material 102. P-wells 118 may be formed by implanting the impurity material into semiconductor substrate 102 at a dose ranging from about $5 \times 10^{12}$ atoms per square centimeter (atoms/cm$^2$) to about $1 \times 10^{14}$ atoms/cm$^2$ and an implant energy ranging from about 25 kilo-electron-Volts (keV) to about 80 keV. The impurity materials are driven into semiconductor material 102 by placing semiconductor material 102 in an inert ambient environment having a temperature ranging from about 1,000° C. to about 1,250° C. for a time ranging from about 2.5 hours to about 3.5 hours and semiconductor material 102 is annealed. By way of example, p-wells 118 are formed by implanting the p-type impurity material at a dose of about $2 \times 10^{13}$ atoms/cm$^2$ and an implant energy of about 35 keV and driving the dopant into semiconductor material 102 for about 3 hours in a nitrogen ambient environment at a temperature of about 1,150° C. Suitable p-type dopants or impurity materials include boron, indium, or the like.

Referring now to FIG. 10, pad oxide layer 116 is removed from surface 104 and another pad oxide layer 120 having a thickness ranging from about 150 Å to about 400 Å is formed on or from surface 104 using a technique such as that described for forming pad oxide layer 116. A layer of photoresist is patterned over implant mask 108A and pad oxide layer 120 to form a masking structure 122 having masking elements 124 and openings 126 that expose portions of pad oxide layer 120. A doped region 128 of n-type conductivity is formed in a p-well 118 and doped regions 130, 132, 134, and 136 of n-type conductivity are formed in p-well 118A by implanting an impurity material of n-type conductivity into p-well 118A. It should be noted that p-well 118A is one of a plurality of p-wells and that reference character "A" has been appended to reference character "118" for the sake of clarity, i.e., the manufacture will be describe with reference to p-well 118A, but it should be understood that there may be more than one doped regions 118 in which semiconductor devices are manufactured. Doped regions 128-136 may be formed by implanting the impurity material into p-wells 118 at a dose ranging from about $3 \times 10^{12}$ atoms/cm$^2$ to about $1 \times 10^{13}$ atoms/cm$^2$ and an implant energy ranging from about 75 keV to about 125 keV. Masking elements 124 are removed and the impurity materials are driven into p-wells 118 and semiconductor substrate 102 is annealed by placing semiconductor substrate 102 in an inert ambient environment at a temperature ranging from about 950° C. to about 1,250° C. for a time ranging from about 30 minutes to about 2 hours. By way of example, doped regions 128-136 are formed by implanting the n-type impurity material at a dose of about $4.3 \times 10^{12}$ atoms/cm$^2$ and an implant energy of about 100 keV and driving the dopant into p-wells 118 for about 1 hour in a nitrogen ambient environment at a temperature of about 1,200° C. Doped regions 128-136 may be referred to as n-wells. Suitable n-type dopants or impurity materials include phosphorus, arsenic, or the like.

Referring now to FIG. 11, pad oxide layer 120 and implant mask 108A are removed using, for example, a wet etch and a dielectric layer 140 having a thickness ranging from about 150 Å to about 750 Å is formed on or from semiconductor substrate 102 by placing semiconductor substrate 102 in an oxidizing ambient environment at a temperature of about 900° C. By way of example, dielectric layer 140 is oxide having a thickness of about 410 Å. Dielectric layer 140 may be referred to as a pad oxide in embodiments in which the material of dielectric layer 140 is oxide. A layer dielectric material 142 having a thickness ranging from about 1,000 Å to about 3,000 Å is formed on pad oxide layer 140. By way of example, dielectric layer 142 is silicon nitride having a thickness of about 1,475 Å and is formed using low pressure chemical vapor deposition. The method of forming silicon nitride layer 142 is not a limitation of the present invention.

A layer of photoresist is patterned over silicon nitride layer 142 to form a masking structure 144 having masking elements 146 and openings 148 that expose portions of silicon nitride layer 142. The exposed portions of silicon nitride layer 142 are removed using for example a reactive ion etch to expose portions of pad oxide layer 140.

Referring now to FIG. 12, masking elements 146 are removed and a layer of photoresist is patterned over silicon nitride layer 142 and the exposed portions of pad oxide layer 140 to form a masking structure 145 having a masking element 147 and openings 149 that expose portions of pad oxide layer 140 and silicon nitride layer 142.

Doped regions 150, 152, and 154 of p-type conductivity are formed in portions of p-well 118A by implanting an impurity material of p-type conductivity into p-well 118A. Doped regions 150-154 may be formed by implanting the impurity material into p-well 118A at a dose ranging from about $5 \times 10^{12}$ atoms/cm$^2$ to about $3.5 \times 10^{13}$ atoms/cm$^2$ and an implant energy ranging from about 20 keV to about 50 keV. By way of example, doped regions 150-154 are formed by implanting the p-type impurity material at a dose of about $3 \times 10^{13}$ atoms/cm$^2$ and an implant energy of about 35 keV. Semiconductor material 102 is annealed. Doped regions 150-154 may be referred to as channel stops. Suitable p-type dopants or impurity materials include boron, indium, or the like. By way of example, doped region 150 is laterally adjacent to doped region 132, doped region 152 is laterally between doped regions 132 and 134, and doped region 154 is laterally between doped regions 134 and 136.

Referring now to FIG. 13, masking element 147 is removed and a field oxidation is performed at a temperature ranging from about 950° C. to about 1,250° C. for a time ranging from about 1 hour to about 5 hours. By way of example, the field oxidation is performed at about 1,000° C. for about 2 hours to form field oxide structures 156, 158, 160, and 162 having a thickness of about 9,500 Å. In accordance with an embodiment, doped region 132 abuts and is laterally between field oxide structures 156 and 158, doped region 134 abuts and is laterally between field oxide structures 158 and 162, and field oxide region 160 extends into doped region 134. Silicon nitride layer 142 is removed using a wet etch process that selectively removes silicon nitride and pad oxide layer 140 is removed using a wet etch process that selectively removes oxide. The methods for removing silicon nitride layer 142 and oxide layer 140 are not limitations of the present invention.

Referring now to FIG. 14, a dielectric layer 166 having a thickness ranging from about 150 Å to about 400 Å is formed on or from semiconductor substrate 102 and field oxide structures 156-162 by placing semiconductor substrate 102 in an oxidizing ambient environment at a temperature of about 900° C. By way of example, dielectric layer 166 is oxide having a thickness of about 250 Å. It should be noted that the thickness of dielectric layer 166 over field oxide structures 156-162 may be very thin, thus it is not shown as being formed over these structures. Dielectric layer 166 may be referred to as a pad oxide layer in embodiments in which the material of dielectric layer 166 is oxide. A layer of photoresist is patterned over pad oxide layer 166 to form a masking structure 168 having masking elements 170 and openings 172 that expose portions of pad oxide layer 166 over a p-well 118A.

A doped region 176 of n-type conductivity is formed in a portion of doped region 130 and p-well 118A and doped regions 178 and 180 of n-type conductivity are formed in doped regions 132 and 134, respectively, by implanting an impurity material of n-type conductivity into p-well 118A. Doped regions 176-180 may be formed by implanting the impurity material at a dose ranging from about $5 \times 10^{14}$ atoms/cm$^2$ to about $1 \times 10^{18}$ atoms/cm$^2$ and an implant energy ranging from about 20 keV to about 100 keV. By way of example, doped regions 176-180 are formed by implanting arsenic at a dose of about $6 \times 10^{15}$ atoms/cm$^2$ and an implant energy of about 65 keV. Suitable n-type dopants or impurity materials include phosphorus, arsenic, or the like.

Referring now to FIG. 15, masking elements 170 are removed and a layer of photoresist is patterned over pad oxide layer 166 to form a masking structure 182 having masking elements 184 and openings 186 that expose portions of pad oxide layer 166. Doped regions 188 and 190 of n-type conductivity are formed in doped region 130 and p-well 118A, respectively, by implanting an impurity material of n-type conductivity into doped region 130 and p-well 118A. Doped regions 188 and 190 may be formed by implanting the impurity material at a dose ranging from about $2.5 \times 10^{12}$ atoms/cm$^2$ to about $5 \times 10^{14}$ atoms/cm$^2$ and an implant energy ranging from about 20 keV to about 100 keV. By way of example, doped regions 188 and 190 are formed by implanting phosphorus at a dose of about $3.5 \times 10^{13}$ atoms/cm$^2$ and an implant energy of about 60 keV. Doped region 188 is within doped region 130 and laterally abuts a side of doped region 176 and doped region 190 is within p-well 118A and laterally abuts doped region 176 at a side of doped region 176 that is opposite to the side at which doped region 188 abuts doped region 176. Suitable n-type dopants or impurity materials include phosphorus, arsenic, or the like. Doped regions 188 and 190 form a portion of a Zener diode.

Referring now to FIG. 16, masking elements 184 are removed and a layer of photoresist is patterned over pad oxide layer 166 to form a masking structure 192 having masking elements 194 and openings 196 that expose portions of pad oxide layer 166. Doped regions 198, 200, and 202 of p-type conductivity are formed in doped region 130, p-well 118A, and doped region 134, respectively, by implanting an impurity material of p-type conductivity into doped regions 130 and 134 and p-well 118A. Doped regions 198, 200, and 202 may be formed by implanting the impurity material at a dose ranging from about $5 \times 10^{14}$ atoms/cm$^2$ to about $1 \times 10^{16}$ atoms/cm$^2$ and an implant energy ranging from about 20 keV to about 100 keV. By way of example, doped regions 198, 200, and 202 are formed by implanting boron at a dose of about $5 \times 10^{15}$ atoms/cm$^2$ and an implant energy of about 50 keV. Doped region 198 is within doped region 130 and laterally abuts a side of doped region 188, doped region 200 is within p-well 118A and laterally abuts doped region 190 at a side of doped region 190 that is opposite to the side at which doped region 176 abuts doped region 190, and doped region 202 is within doped region 134 and laterally between field oxide structures 158 and 160. Suitable p-type dopants or impurity materials include boron, indium, or the like.

Referring now to FIG. 17, masking elements 194 are removed and pad oxide layer 166 is removed and a layer of dielectric material 206 is formed on semiconductor substrate 102 and field oxide structures 156-162, a layer of dielectric material 208 is formed on dielectric layer 206, and a layer of dielectric material 210 is formed on dielectric layer 208. By way of example, dielectric layer 206 is formed by oxidation and has a thickness ranging from about 100 Å to about 500 Å, dielectric layer 208 is an undoped silicon glass formed by plasma enhanced chemical vapor deposition and has a thickness ranging from about 1,000 Å to about 3,000 Å, and dielectric layer 210 is a borophosphosilicate glass formed by plasma enhanced chemical vapor deposition and has a thickness ranging from about 5,000 Å to about 10,000 Å. By way of example, dielectric layer 206 has a thickness of about 140 Å, dielectric layer 208 has a thickness of about 1,300 Å, and dielectric layer 210 has a thickness of about 6,000 Å. A reflow cycle is performed at a temperature ranging from about 900° C. to about 1,000° C. to planarize dielectric layer 210 and to activate the dopants of doped regions 176, 178, 180, 188, 190, 198, 200, and 202. By way of example, the reflow cycle is at a temperature of about 950° C. It should be noted that the thicknesses and methods of forming dielectric layers 208, 208, and 210 are not limitations of the present invention.

Still referring to FIG. 17, a layer of photoresist is patterned over dielectric layer 210 to form a masking structure 212 having masking elements 214 and openings 216 that expose portions of dielectric layer 210. The portions of dielectric layer 210 exposed by openings 216 and the portions of dielectric layers 208 and 206 unprotected by masking elements 214 are removed using, for example, a wet etch process. Removing the portions of dielectric layers 210, 208, and 206 exposes portions of doped regions 176, 178, 180, 198, 200, and 202.

Referring now to FIG. 18, masking elements 214 are removed and a layer of refractory metal (not shown) is deposited over dielectric layer 210 and the exposed portions of doped regions 176, 178, 180, 198, 200, and 202. By way of example, the refractory metal is titanium having a thickness ranging from about 100 Å to about 1,000 Å. A rapid thermal anneal is performed wherein the refractory metal is heated to a temperature ranging from about 500° C. to about 700° C. The heat treatment causes the titanium to react with the silicon to form titanium silicide in all regions in which the titanium is in contact with silicon or polysilicon. Alternatively, the refractory metal can be titanium nitride, tungsten, cobalt, or the like. The silicide formed by the rapid thermal anneal serves as a barrier layer.

A layer of aluminum copper silicon 220 is formed over the barrier metal layers (not shown) and dielectric layer 210. By way of example, aluminum copper silicon layer 220 is sputtered onto the barrier metal layers and dielectric layer 210 and has a thickness ranging from about 1 micrometer μm to about 4 μm. Alternatively, layer 220 may be aluminum, aluminum copper, aluminum silicon, or the like. A layer of photoresist is patterned over aluminum copper silicon layer 220 to form a masking structure 222 having masking elements 224 and openings 226 that expose portions of aluminum copper silicon layer 220.

Referring now to FIG. 19, the exposed portions of aluminum copper silicon layer 220 are removed using a metal etching process and leaving contacts 220A, 220B, 220C, 220D, 220E, and 220F. Layer 220 may be etched using a plasma etch or a wet etch. Contact 220B serves as an anode contact for a Zener diode and contact 220C serves as a cathode contact for the Zener diode. It should be noted that doped region 198 serves as the anode of the Zener diode and doped regions 176, 188, 190 and 118A cooperate to form the cathode of the Zener diode. Contact 220D forms the anode contact of a steering diode, e.g., a down diode, contact 220E forms the cathode contact of the down diode and the anode contact of another steering diode, e.g., the up diode, and contact 220F forms the cathode of the up diode. Doped region 200 and a portion of p-well 118A form the anode of the down diode, doped regions 132 and 178 cooperate to form the cathode of the down diode, doped region 202 forms the anode of the up diode, and doped regions 134 and 180 form the cathode of the up diode. Contact 220A may serve as a connection contact to make a connection between the common mode filter and other circuit elements. It should be noted that the Zener diode, the down diode, and the up diode formed in p-well 118A cooperate to form a protection structure such as, for example, an ESD protection device.

Still referring to FIG. 19, a passivation layer 230 is formed on electrodes 220A-220F and on the exposed portions of dielectric layer 210. By way of example, passivation layer 230 comprises a layer of silicon nitride formed on a layer of oxide, wherein a thickness of the oxide layer may be about 5 kÅ and the thickness of the nitride layer may be about 7 kÅ. Alternatively, passivation layer 230 may be comprised of a single layer of nitride or other suitable dielectric material. A layer of photoresist is patterned over passivation layer 230 to form a masking structure 232 having masking elements 234 and openings 236 that expose portions of passivation layer 230.

Figure 20:
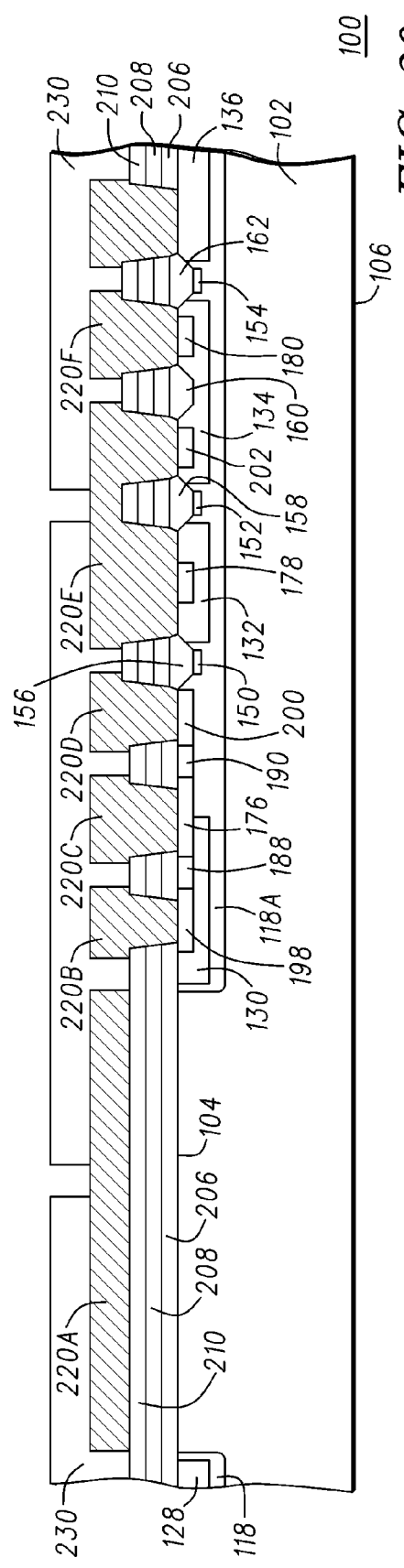
FIG. 20 is a cross-sectional view of the semiconductor component of FIG. 19 at a later stage of manufacture.

Referring now to FIG. 20, the portions of passivation layer 230 exposed by openings 236 are removed using, for example, a wet etch. Removing the portions of passivation layer 230 exposes portions of electrodes 220A and 220E.

Figure 21:
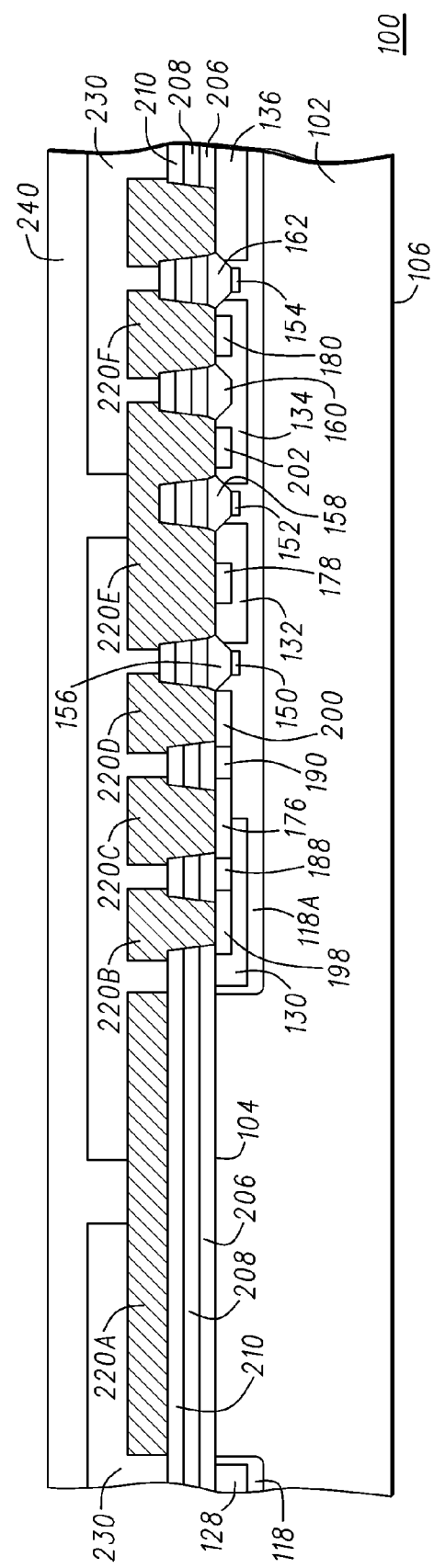
FIG. 21 is a cross-sectional view of the semiconductor component of FIG. 20 at a later stage of manufacture.

Referring now to FIG. 21, masking elements 234 are removed and a photosensitive polyimide layer 240 is formed over passivation layer 230 and the exposed portions of contacts 220A and 220E. By way of example, polyimide layer 240 is dispensed to have a thickness of about 16 μm and then spin coated to have a substantially planar surface and a post-cure thickness of at least about 4 μm. Alternatively, the post-cure thickness of polyimide layer 240 may be at least 5 μm, or at least 8 μm, or at least 10 μm. Suitable photosensitive polyimide materials include photosensitive polyimide sold under the trademark PIMEL from Asahi, HDM polymeric coatings from Hitachi Chemical and DuPont Electronics, polybenzoxazole (PBO), bisbenzocyclobutene (BCB), or the like. It should be noted that layer 240 is not limited to being a photosensitive polyimide but may be a non-photosensitive material that is patterned using photoresist.

Referring now to FIG. 22, portions of polyimide layer 240 above the portions of electrodes 220A and 220E that were exposed through openings in passivation layer 230 are removed by exposure to electromagnetic radiation followed by a develop step. Polyimide layer 240 is cured after removal of the portions exposed to the electromagnetic radiation. Removal of the exposed portions of polyimide layer 240 re-exposes portions of electrodes 220A and 220E.

Referring now to FIG. 23, an adhesion layer 242 having a thickness ranging from about 1,500 Å to about 2,500 Å is formed on polyimide layer 240 and on the exposed portions of electrodes 220A and 220E. Suitable materials for adhesion layer 242 include titanium tungsten, titanium nitride, titanium, tungsten, platinum, or the like. A copper seed layer 244 having a thickness ranging from about 1,500 Å to about 2,500 Å is formed on adhesion layer 242. By way of example, layers 242 and 244 each have a thickness of about 2,000 Å. A layer of photoresist 246 is formed on copper seed layer 244. Preferably, the thickness of photoresist layer 246 is selected to be thicker than the thickness of the copper to be plated in a subsequent step. By way of example, the thickness of photoresist layer 246 is about 14 μm.

Figure 24:
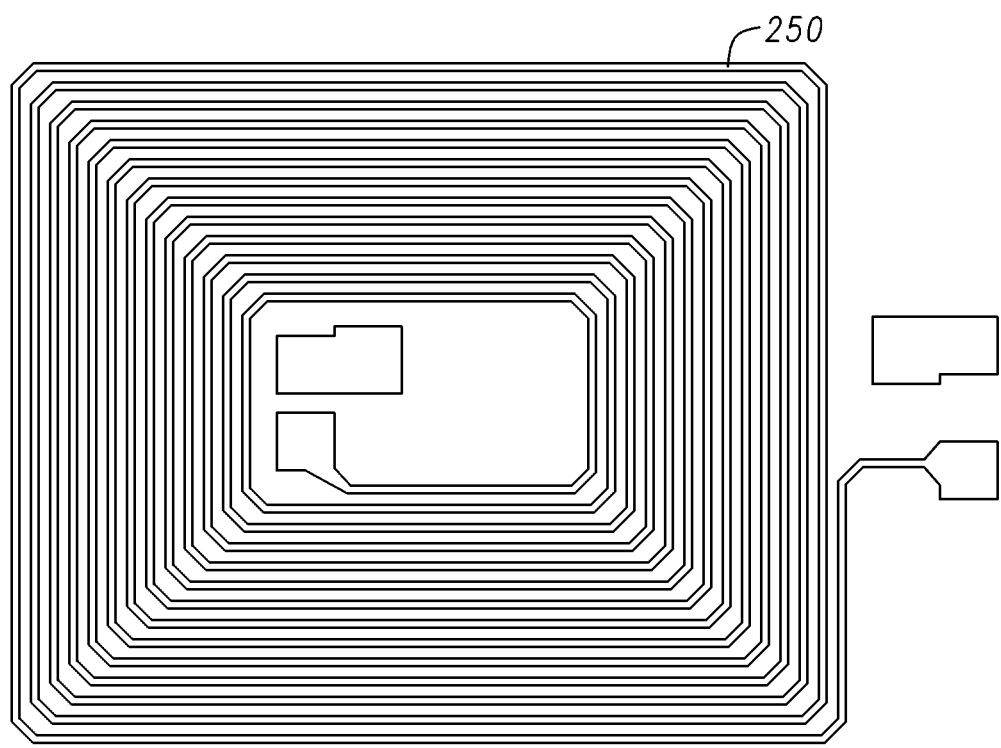
FIG. 24 is a top view of a coil pattern for use in manufacturing the semiconductor component of FIG. 23.

Briefly referring to FIG. 24, a mask 248 having a masking pattern 250 is illustrated for patterning photoresist layer 246. Light passes through the cross-hatched regions to expose portions of photoresist layer 246. The portions of photoresist layer 246 exposed to light are removed, exposing portions of copper seed layer 244 shown in FIG. 25.

Figure 25:
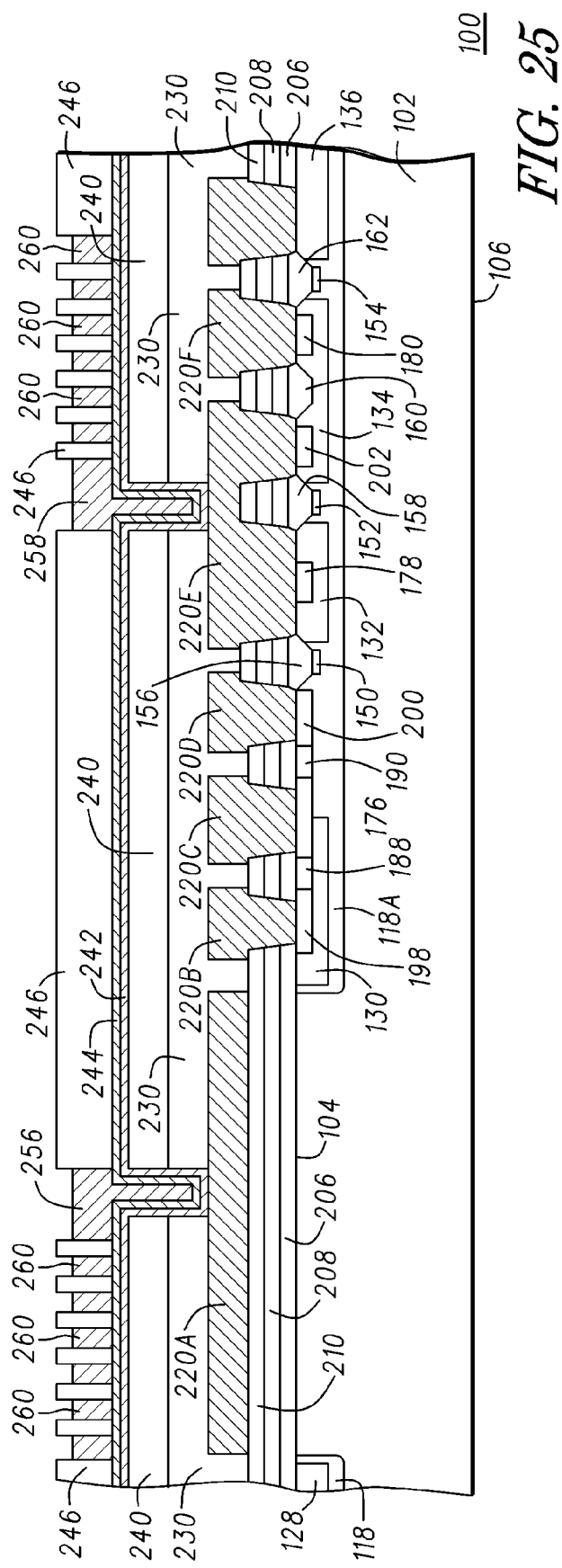
FIG. 25 is a cross-sectional view of the semiconductor component of FIG. 23 at a later stage of manufacture.

Referring now to FIG. 25, after the patterning of photoresist layer 246, copper is plated onto the exposed portions of copper seed layer 244 forming a contact structure 256 that may be in electrical contact with contact 220A and a contact structure 258 that may be in electrical contact with contact 220E. Plating the copper forms coil 260 of an inductor such as, for example, inductor 16 described with reference to FIGS. 1-4 or inductor 70 described with reference to FIGS. 5-7. It should be noted that an inductor comprises a coil having turns, thus the coil may be referred to as an inductor or turns.

Figure 26:
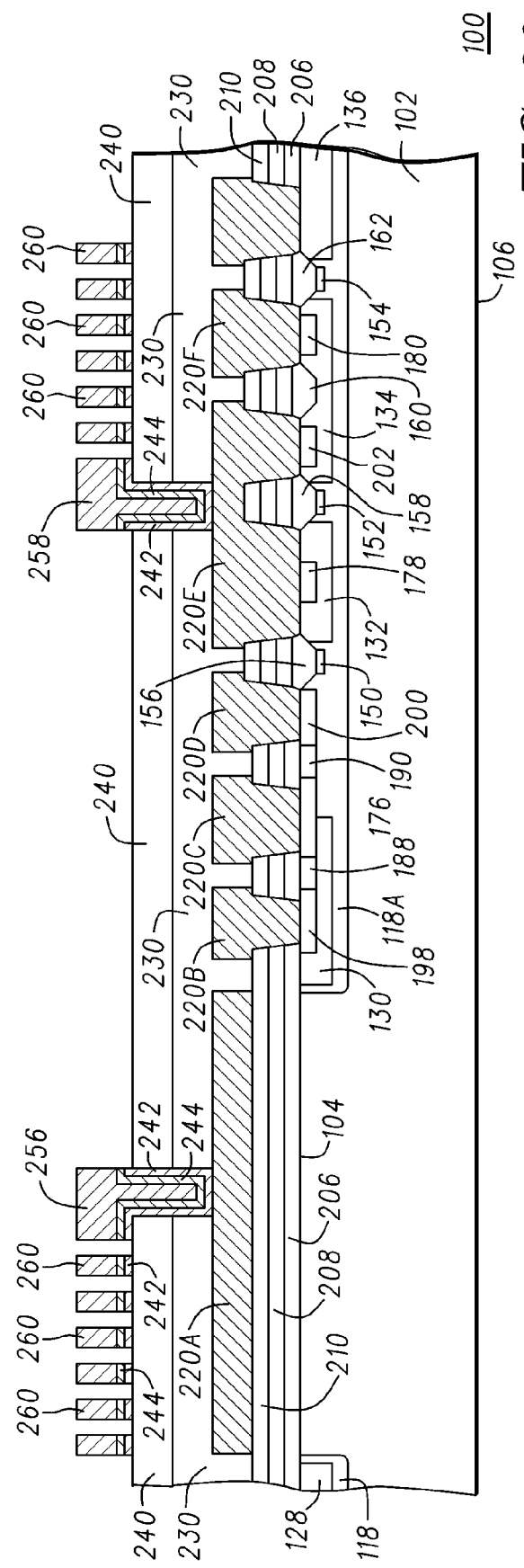
FIG. 26 is a cross-sectional view of the semiconductor component of FIG. 25 at a later stage of manufacture.

Referring now to FIG. 26, photoresist layer 186 is removed, which exposes portions of copper seed layer 244. The exposed portions of copper seed layer 244 and the portions of adhesion layer 242 under the exposed portions of copper seed layer 244 are removed using, for example, a wet etch process. It should be noted that copper seed layer 244 and adhesion layer 242 may be removed using different etching materials. Alternatively, a dry etch may be used to remove the exposed portions of layers 244 and 242.

Figure 27:
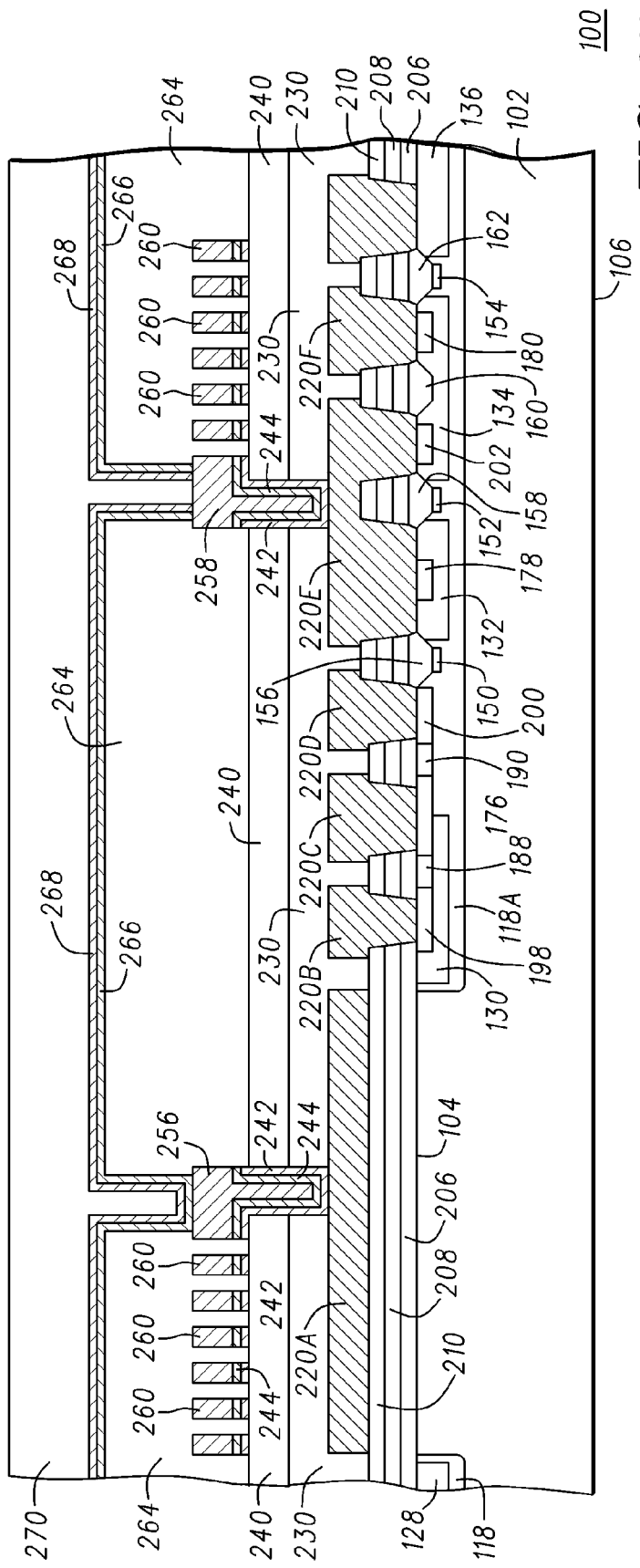
FIG. 27 is a cross-sectional view of the semiconductor component of FIG. 26 at a later stage of manufacture.

Referring now to FIG. 27, a polyimide layer 264 is formed on the exposed portions of polyimide layer 240, the exposed portions of contact structures 256 and 258, and on coil 260. By way of example, polyimide layer 264 is dispensed to have a thickness of about 16 μm and then spin coated to have a substantially planar surface and a post-cure thickness of about 10 μm. It should be noted that the thickness of polyimide layer 264 is selected to reduce parasitics, e.g., parasitic capacitances or the like between contact structures 256 and 258, and coil 260, and a copper layer to be plated above polyimide layer 264. Suitable photosensitive polyimide materials have been described with reference to polyimide layer 240. Like layer 240, layer 264 is not limited to being a photosensitive polyimide but may be a non-photosensitive material that is patterned using photoresist. Portions of polyimide layer 264 above the portions of contact structures 256 and 258 are removed by exposure to electromagnetic radiation followed by a develop step. Polyimide layer 264 is cured after removal of the portions exposed to the electromagnetic radiation. Removal of the exposed portions of polyimide layer 264 exposes portions of contact structures 256 and 258.

Still referring to FIG. 27, an adhesion layer 266 having a thickness ranging from about 1,500 Å to about 2,500 Å is formed on polyimide layer 264 and on the exposed portions of contact structures 256 and 258. Suitable materials for adhesion layer 266 include titanium tungsten, titanium nitride, titanium, tungsten, platinum, or the like. A copper seed layer 268 having a thickness ranging from about 1,500 Å to about 2,500 Å is formed on adhesion layer 266. A layer of photoresist 270 is formed on copper seed layer 268. Preferably, the thickness of photoresist layer 270 is selected to be greater than the thickness of a copper layer to be plated on copper seed layer 268. The thickness of photoresist layer 270 may range from about 5 µm to about 20 µm and may be, for example, about 14 µm. As those skilled in the art will appreciate, the thickness of photoresist layer 270 may be process limited because of line width definition limitations.

Figure 28:
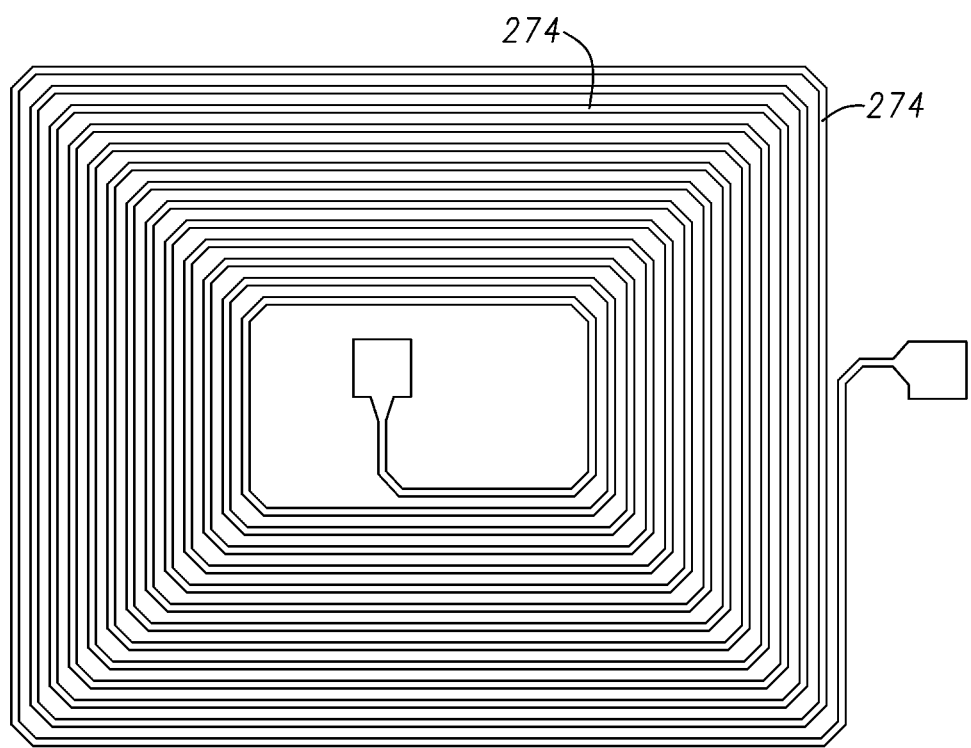
FIG. 28 is a top view of a coil pattern for use in manufacturing the semiconductor component of FIG. 27.

Briefly referring to FIG. 28, a mask 272 having a masking pattern 274 is illustrated for patterning photoresist layer 270. Light passes through the cross-hatched regions to expose portions of photoresist layer 270. The portions of photoresist layer 270 exposed to light are removed, exposing portions of copper seed layer 268.

Figure 29:
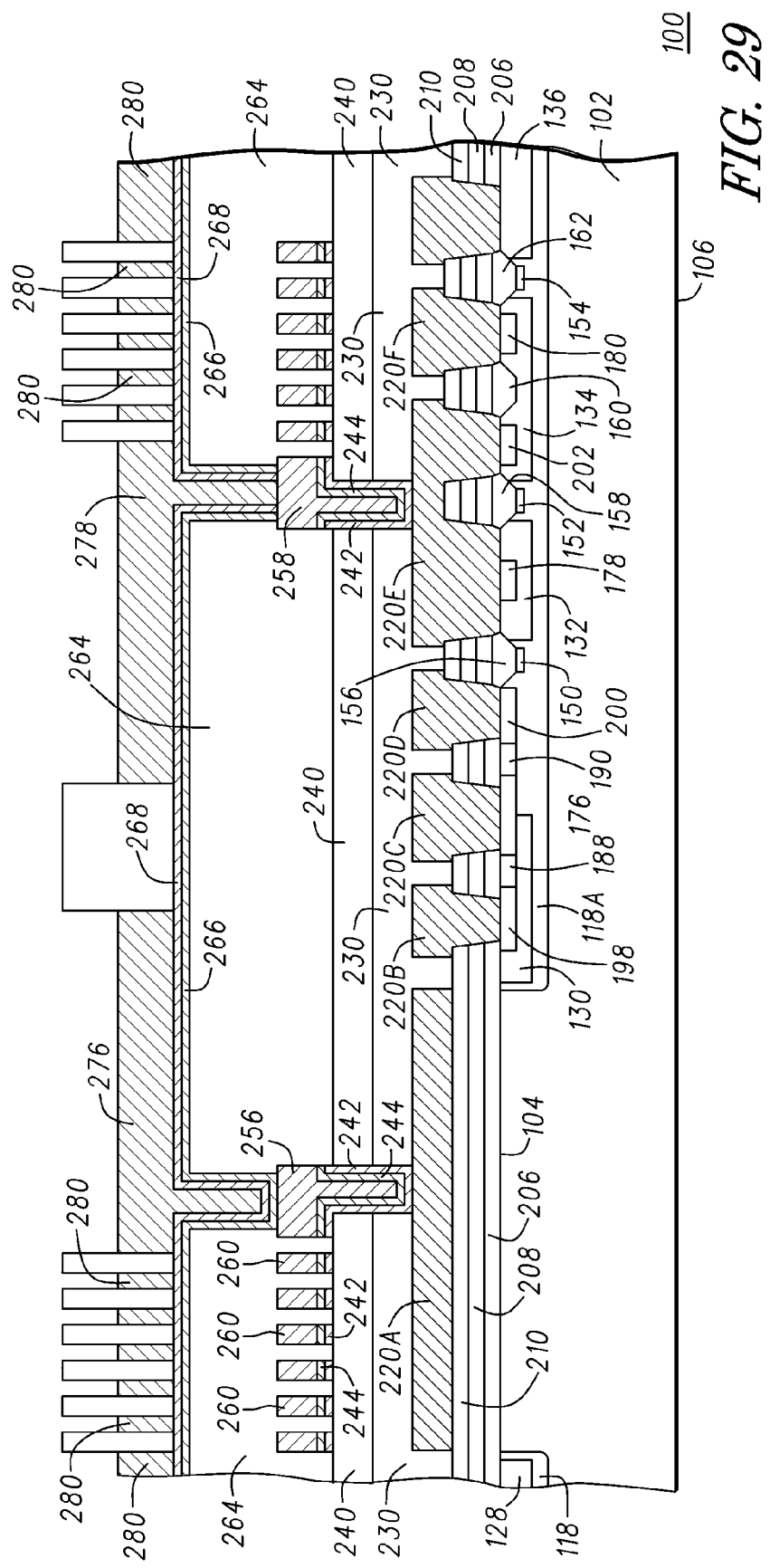
FIG. 29 is a cross-sectional view of the semiconductor component of FIG. 28 at a later stage of manufacture.

Referring now to FIG. 29, after patterning photoresist layer 270, copper is plated onto the exposed portions of copper seed layer 268 forming a contact structure 276 that extends from contact structure 256, forming a contact structure 278 that extends from contact 258, and forming a coil 280 or an inductor such as inductor 18 shown in FIG. 1.

Figure 30:
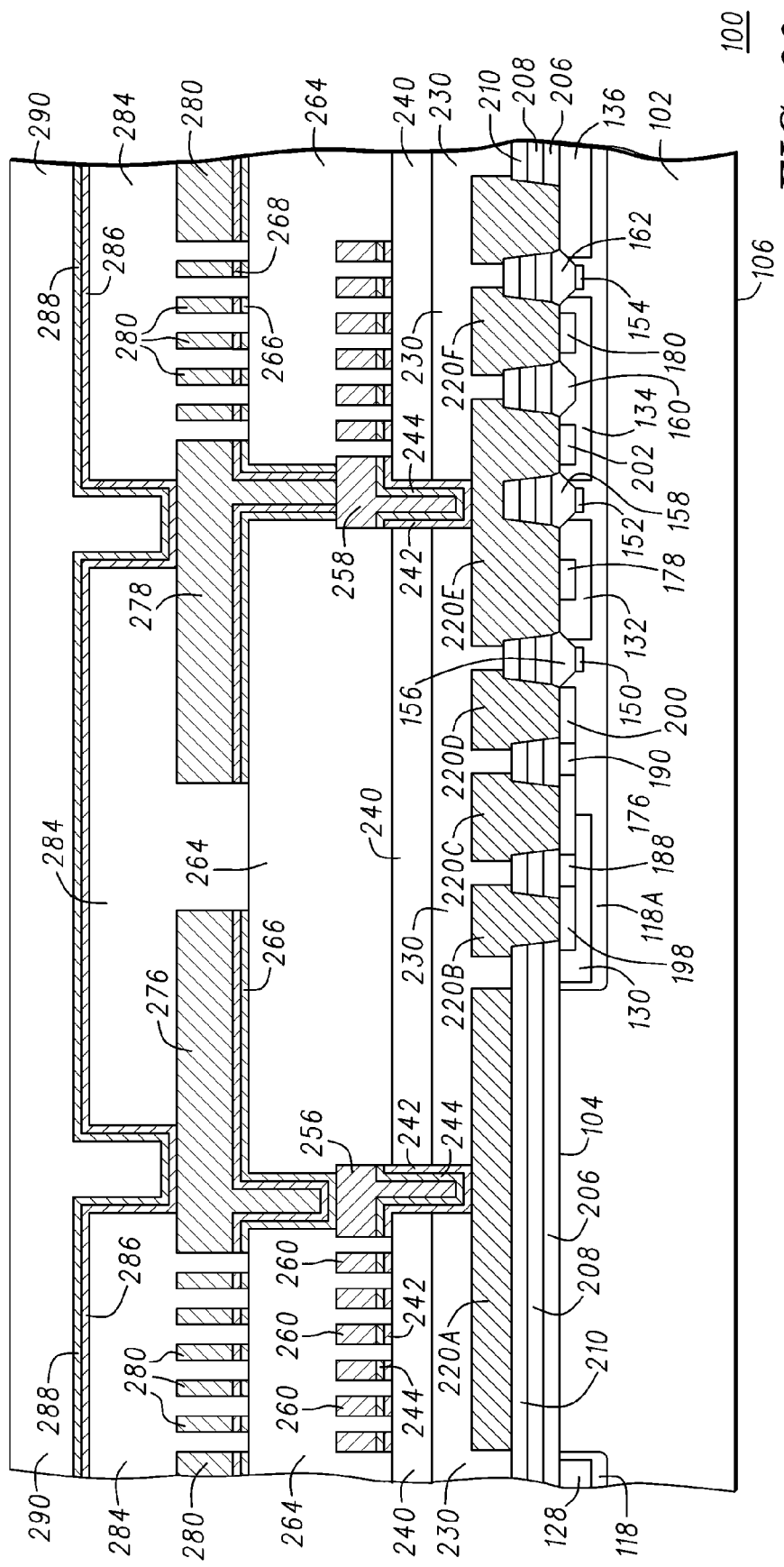
FIG. 30 is a cross-sectional view of the semiconductor component of FIG. 29 at a later stage of manufacture.

Referring now to FIG. 30, photoresist layer 270 is removed, which exposes portions of copper seed layer 268. The exposed portions of copper seed layer 268 and the portions of adhesion layer 266 under the exposed portions of copper seed layer 268 are removed using, for example, a wet etch process. A polyimide layer 284 is formed on the exposed portions of polyimide layer 264, the exposed portions of contact structures 276 and 278, and on coil 280. By way of example, polyimide layer 284 is dispensed to have a thickness of about 16 µm and then spin coated to form a substantially planar surface. It should be noted that after curing, the thickness of polyimide layer 240 is at least about 5 µm and may be at least about 10 µm. The thickness of polyimide layer 284 is selected to reduce parasitics, e.g., parasitic capacitances between contact structures 276 and 278, and coil 280, and a copper layer to be plated above polyimide layer 284. Suitable photosensitive polyimide materials have been described with reference to polyimide layer 240. Like layer 240, layer 284 is not limited to being a photosensitive polyimide but may be a non-photosensitive material that is patterned using photoresist. Portions of polyimide layer 284 above the portions of contact structures 276 and 278 are removed by exposure to electromagnetic radiation followed by a develop step. Polyimide layer 284 is cured after removal of the portions exposed to the electromagnetic radiation. Removal of the exposed portions of polyimide layer 284 exposes portions of contact structures 276 and 278.

Still referring to FIG. 30, an adhesion layer 286 having a thickness ranging from about 1,500 Å to about 2,500 Å is formed on polyimide layer 284 and on the exposed portions of contact structures 276 and 278. Suitable materials for adhesion layer 286 include titanium tungsten, titanium nitride, titanium, tungsten, platinum, or the like. A copper seed layer 288 having a thickness ranging from about 1,500 Å to about 2,500 Å is formed on adhesion layer 232. A layer of photoresist 290 is formed on copper seed layer 288. Preferably, the thickness of photoresist layer 290 is selected to be greater than the thickness of a copper layer to be plated on copper seed layer 288. The thickness of photoresist layer 290 may range from about 5 µm to about 20 µm and may be, for example, about 14 µm. As discussed above, the thickness of photoresist layer 290 may be selected in accordance with line width definition limitations.

Figure 31:
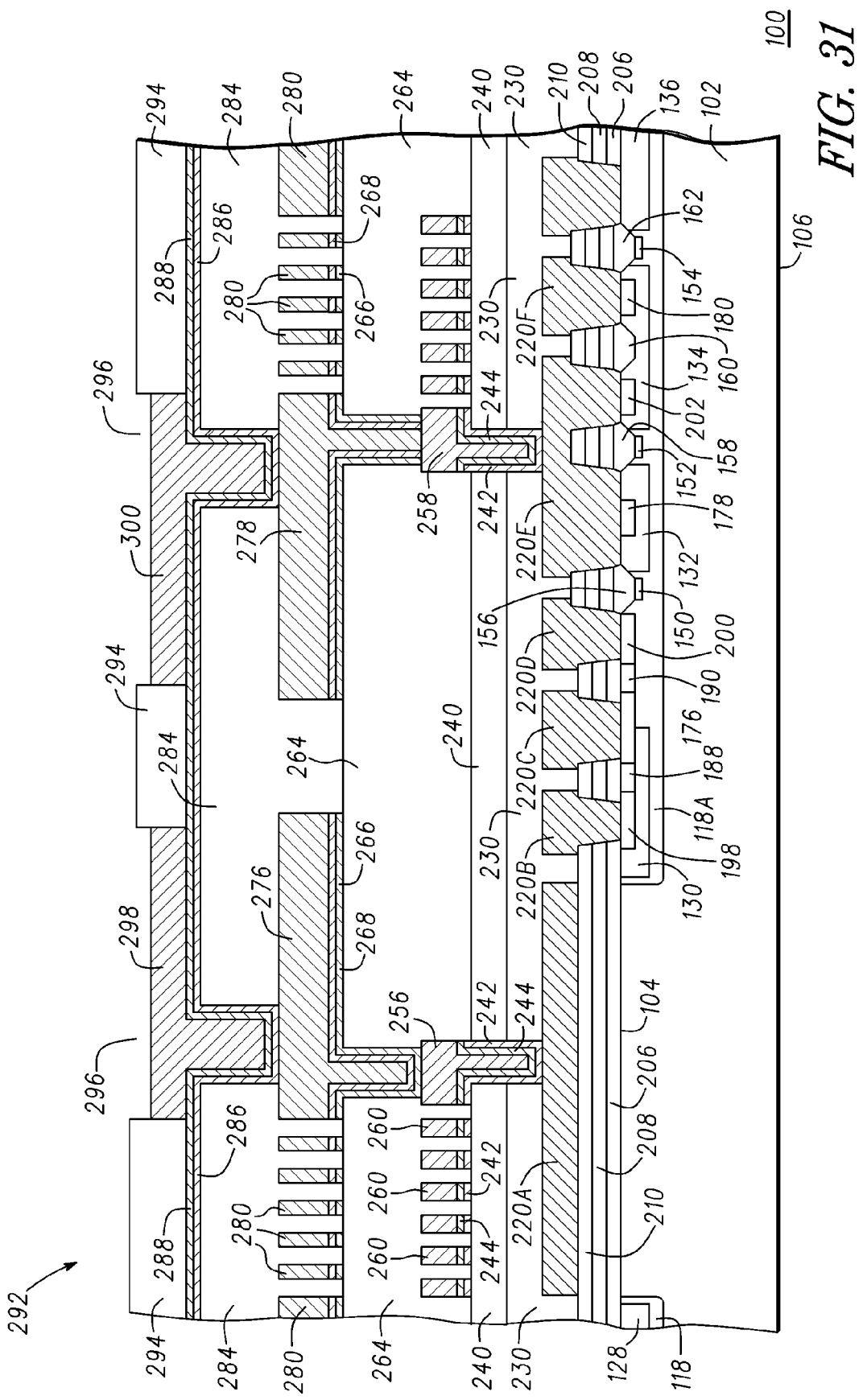
FIG. 31 is a cross-sectional view of the semiconductor component of FIG. 30 at a later stage of manufacture.

Referring now to FIG. 31, photoresist layer 290 is patterned to form a masking structure 292 having masking elements 294 and openings 296, which openings 296 expose portions of copper seed layer 288 over electrode structures 276 and 278. After formation of masking elements 294, copper is plated onto the exposed portions of copper seed layer 288 forming a UBM pad 298 that extends from contact structure 276 and a UBM pad 300 that extends from contact structure 278.

Referring now to FIG. 32, masking elements 294 are removed and solder bumps 302 and 304 are formed on UBM pads 298 and 300, respectively. By way of example, solder bumps 302 and 304 are formed by using a stencil to apply solder flux, placing solder balls on UBM pads 298 and 300, and placing substrate 102 in a reflow furnace to form solder bumps 302 and 304.

By now it should be appreciated that a small outline, low profile, semiconductor component that includes a monolithically integrated CMF and ESD devices and methods for manufacturing the semiconductor component have been provided. The semiconductor component is formed as a Chip Scale Package having a differential bandwidth of at least 2 GigaHertz, a common mode rejection of less than 15 dB at 500 MegaHertz, ESD protection with a capacitance of less than 1.5 picoFarads that meets the mobile device drop test and temperature cycle standards. The CSP package can be configured to have an optional ESD protection pin as illustrated in FIGS. 26 and 27.

Although certain preferred embodiments and methods have been disclosed herein, it will be apparent from the foregoing disclosure to those skilled in the art that variations and modifications of such embodiments and methods may be made without departing from the spirit and scope of the invention. For example, the photoresist used in the subject invention may be positive or negative photoresist. In addition, the conductivity types may be switched to form semiconductor devices, e.g., the transistors may be p-channel devices rather than n-channel devices. It is intended that the invention shall be limited only to the extent required by the appended claims and the rules and principles of applicable law.

What is claimed is:

1. A method for manufacturing a semiconductor component, comprising:
providing a semiconductor material having a resistivity of at least 5 Ohm-centimeters;
forming a protection device from the semiconductor material by
forming a doped region of a first conductivity type in the semiconductor material;
forming the protection device from the doped region of the first conductivity type, wherein forming the protection device comprises forming an ElectroStatic Discharge protection device; and
monolithically integrating a common mode filter over the semiconductor material.

2. The method of claim 1, wherein forming the ElectroStatic Discharge protection device comprises forming first and second diodes from the semiconductor material.

3. The method of claim 1, wherein providing the semiconductor material comprises providing the semiconductor material having a resistivity of at least 500 Ohm-centimeters.

4. The method of claim 1, wherein forming the common mode filter comprises:
   forming a first layer of material over a layer of dielectric material; and
   forming a first electrically conductive coil structure over the first layer of material.

5. The method of claim 4, wherein the first layer of material is a photosensitive material.

6. A method for manufacturing a semiconductor component, comprising:
   providing a semiconductor material having a resistivity of at least 5 Ohm-centimeters;
   forming a doped region of a first conductivity type in the semiconductor material;
   forming a protection device from the doped region of a first conductivity type from the doped region of the semiconductor material; and
   monolithically integrating a common mode filter over the semiconductor material by
      forming a first layer of material over a layer of dielectric material; and
      forming a first electrically conductive coil structure over the first layer of material;
      forming a second layer of material over the electrically conductive coil structure and over a portion of the first layer of material;
      forming a second electrically conductive coil structure over the second layer of material;
      forming a third layer of material over the second electrically conductive coil structure and over a portion of the second layer of material;
      forming an opening in the third layer of material; and
      forming an electrically conductive material in the opening in the third layer of material, wherein the first, second, and third layers of material are photosensitive materials.

7. The method of claim 6, further including forming solder balls over the electrically conductive material in the opening in the third layer of photosensitive material.

8. A method for manufacturing a chip scale package that includes a common mode filter monolithically integrated with a protection device, comprising:
   providing a semiconductor material having a resistivity of at least 5 Ohm-centimeters;
   forming a first doped region of a first conductivity type in the semiconductor material;
   forming the protection device from the first doped region;
   forming at least one contact to the semiconductor material;
      forming the common mode filter over the semiconductor material by forming a first layer of photosensitive material over the semiconductor material and the at least one contact; and
      forming an opening in the first layer of photosensitive material that exposes the at least one contact.

9. The method of claim 8, wherein forming the protection device comprises forming the protection device having a capacitance less than 10 picoFarads.

10. The method of claim 8, wherein forming the common mode filter further comprises:
   forming a first electrically conductive material over the photosensitive material;
   forming a first masking structure over the first electrically conductive material, the first masking structure protecting a portion of the first electrically conductive material and having an opening that exposes a portion of the first electrically conductive material and the opening in the first layer of photosensitive material; and
   forming a second electrically conductive material on the exposed portions of the first electrically conductive material and in the opening in the first layer of photosensitive material.

11. The method of claim 10, wherein forming the common mode filter further comprises:
   removing the first masking structure to expose portions of the second electrically conductive material;
   removing portions of the first electrically conductive material that were protected by the first masking structure to expose portions of the first layer of photosensitive material; and
   forming a second layer of photosensitive material over exposed portions of the first photosensitive material and over the second electrically conductive material.

12. The method of claim 11, wherein forming the common mode filter further comprises:
   forming an opening in the second layer of photosensitive material;
   forming a second masking structure over the second layer of photosensitive material, the second masking structure having an opening; and
   forming a third electrically conductive material in the opening.

13. The method of claim 12, wherein forming the common mode filter further comprises:
   removing the second masking structure to expose portions of the second electrically conductive material;
   exposing portions of the second layer of photosensitive material that were protected by the second masking structure; and
   forming a third layer of photosensitive material over exposed portions of the second photosensitive material and over the third electrically conductive material.

14. The method of claim 13, wherein forming the common mode filter further comprises:
   forming an opening in the third layer of photosensitive material;
   forming a third masking structure over the third layer of photosensitive material, the third masking structure having an opening; and
   forming a fourth electrically conductive material in the opening.

15. The method of claim 14, wherein forming the first masking structure includes forming the first masking structure to have an opening having a spiral-shaped portion and wherein forming the second masking structure includes forming the second masking structure to have an opening having a spiral-shaped portion.

16. A monolithically integrated common mode filter and protection device configured as a chip scale package, comprising:
   a semiconductor material having a resistivity of at least 5 Ohm-centimeters;
   a protection device formed from the semiconductor material;
   a first layer of material over the semiconductor material, the first layer of the first material having an opening filled with a first electrically conductive material, wherein the first layer of material is a photosensitive material; and
   a first coil over the first layer of material.

17. The monolithically integrated common mode filter and protection device of claim 16, further including:
   a second layer material over the first layer of material having an opening filled with a second electrically conductive material, wherein the second layer of material is a photosensitive material; and a second coil over the second layer of layer of material.

\* \* \* \* \*